US010513923B2

(12) United States Patent
Coenen et al.

(10) Patent No.: US 10,513,923 B2
(45) Date of Patent: Dec. 24, 2019

(54) DYNAMICALLY MODELING A HYDRAULIC FRACTURE

(71) Applicant: REVEAL ENERGY SERVICES, INC., Houston, TX (US)

(72) Inventors: Erica Coenen, Spring, TX (US); Sean Andrew Spicer, Houston, TX (US); Sudhendu Kashikar, Katy, TX (US)

(73) Assignee: Reveal Energy Services, Inc., Houston, TX (US)

( * ) Notice: Subject to any disclaimer, the term of this patent is extended or adjusted under 35 U.S.C. 154(b) by 0 days.

(21) Appl. No.: 16/044,160

(22) Filed: Jul. 24, 2018

(65) Prior Publication Data

US 2019/0024505 A1   Jan. 24, 2019

Related U.S. Application Data

(60) Provisional application No. 62/536,210, filed on Jul. 24, 2017.

(51) Int. Cl.
| | |
|---|---|
| *E21B 49/00* | (2006.01) |
| *G01V 99/00* | (2009.01) |
| *E21B 47/06* | (2012.01) |
| *E21B 43/26* | (2006.01) |
| *E21B 43/267* | (2006.01) |
| *G06F 17/50* | (2006.01) |

(52) U.S. Cl.
CPC .............. *E21B 49/00* (2013.01); *E21B 43/26* (2013.01); *E21B 43/267* (2013.01); *E21B 47/06* (2013.01); *G01V 99/005* (2013.01); *G06F 17/5009* (2013.01); *G01V 2210/646* (2013.01)

(58) Field of Classification Search
CPC .......... E21B 49/00; E21B 43/26; E21B 47/06; G01V 99/005
USPC ........................................................... 703/10
See application file for complete search history.

(56) References Cited

U.S. PATENT DOCUMENTS

| | | | |
|---|---|---|---|
| 5,431,227 A | 7/1995 | Montgomery et al. | |
| 8,439,116 B2 * | 5/2013 | East, Jr. ................ | E21B 43/305 166/250.1 |
| 9,187,992 B2 | 11/2015 | Cherian et al. | |
| 9,988,895 B2 | 6/2018 | Roussel et al. | |
| 9,988,900 B2 | 6/2018 | Kampfer et al. | |
| 10,030,497 B2 | 7/2018 | Dawson et al. | |

(Continued)

*Primary Examiner* — Saif A Alhija
(74) *Attorney, Agent, or Firm* — Fish & Richardson P.C.

(57) ABSTRACT

Techniques for determining a hydraulic fracture dimension include identifying pressure signal values of a first fracturing fluid in a monitor wellbore that represent a pressure change in the first fracturing fluid that is induced by formation of a second hydraulic fracture from a treatment wellbore; determining a particular pressure signal value of the plurality of pressure signal values; based on the determined particular pressure signal value, determining a particular dimension of the second hydraulic fracture formed from the treatment wellbore; and determining, based at least in part on (i) the determined particular dimension, and (ii) a first pressure signal value of the plurality of pressure signal values that is less than the determined particular pressure signal value, a first intermediate dimension of the second hydraulic fracture that is less than the determined particular dimension of the second hydraulic fracture.

30 Claims, 13 Drawing Sheets

(56) References Cited

U.S. PATENT DOCUMENTS

| | | | |
|---|---|---|---|
| 2008/0190603 A1* | 8/2008 | Brannon | E21B 43/26 166/250.1 |
| 2009/0145660 A1 | 6/2009 | Johnson et al. | |
| 2009/0188665 A1 | 7/2009 | Tubel et al. | |
| 2009/0281776 A1 | 11/2009 | Cheng et al. | |
| 2010/0004906 A1 | 1/2010 | Searles et al. | |
| 2012/0241152 A1* | 9/2012 | Brannon | E21B 43/26 166/280.2 |
| 2012/0296619 A1 | 11/2012 | Maliassov et al. | |
| 2013/0140031 A1 | 6/2013 | Cohen et al. | |
| 2014/0067353 A1 | 3/2014 | Shelley et al. | |
| 2015/0075777 A1 | 3/2015 | Walters et al. | |
| 2015/0075779 A1 | 3/2015 | Walters et al. | |
| 2015/0083398 A1 | 3/2015 | Dawson | |
| 2015/0176394 A1 | 6/2015 | Roussel et al. | |
| 2015/0204175 A1* | 7/2015 | Soliman | E21B 43/26 166/308.1 |
| 2015/0241584 A1 | 8/2015 | Aarre | |
| 2016/0003020 A1* | 1/2016 | Sharma | E21B 43/26 166/250.1 |
| 2016/0061022 A1 | 3/2016 | McCoy | |
| 2016/0177693 A1 | 6/2016 | Gomaa et al. | |
| 2016/0237799 A1 | 8/2016 | Dawson | |
| 2016/0333680 A1 | 11/2016 | Richter et al. | |
| 2017/0002652 A1 | 1/2017 | Kampfer et al. | |
| 2017/0114613 A1* | 4/2017 | Lecerf | E21B 41/0092 |
| 2017/0122077 A1 | 5/2017 | Shahri et al. | |
| 2017/0145793 A1 | 5/2017 | Ouenes | |
| 2017/0247995 A1 | 8/2017 | Crews et al. | |
| 2017/0370208 A1 | 12/2017 | Dawson | |
| 2018/0003033 A1 | 1/2018 | Dawson | |
| 2018/0135401 A1 | 5/2018 | Dykstra et al. | |
| 2018/0258760 A1 | 9/2018 | Kashikar et al. | |
| 2019/0026409 A1 | 1/2019 | Whilhelmina et al. | |

* cited by examiner

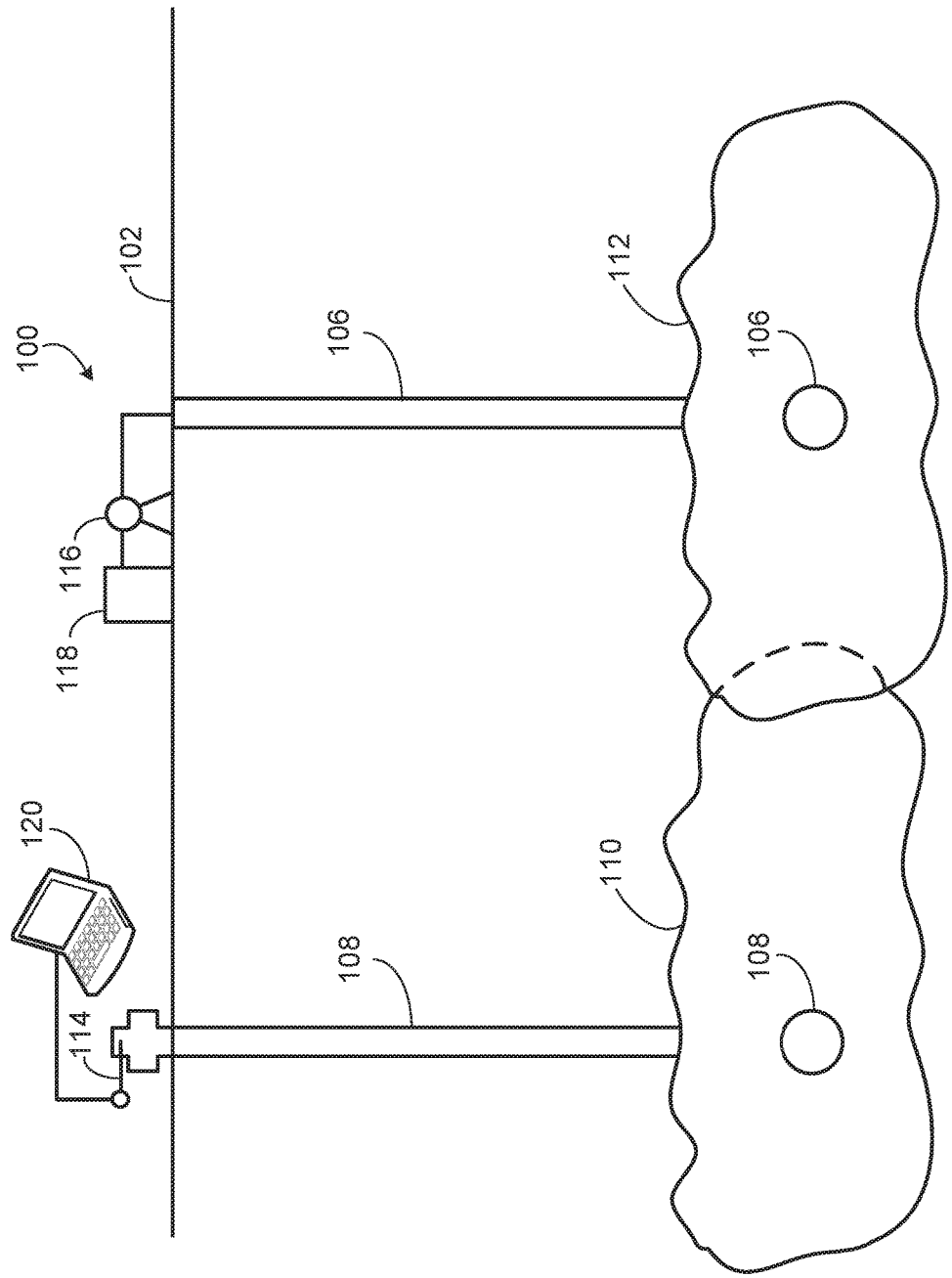

DYNAMICALLY MODELING A HYDRAULIC FRACTURE

CROSS-REFERENCE TO RELATED APPLICATION

This application claims priority under 35 U.S.C. § 119 to U.S. Provisional Patent Application Ser. No. 62/536,210, filed on Jul. 24, 2017, and entitled "DYNAMICALLY MODELING A HYDRAULIC FRACTURE," the entire contents of which are hereby incorporated by reference.

TECHNICAL FIELD

This specification relates to systems and method for dynamically modeling one or more hydraulic fractures to adjust or control a hydraulic fracturing system.

BACKGROUND

Certain geologic formations, such as unconventional reservoirs in shale, sandstone, and other rock types, often exhibit increased hydrocarbon production subsequent to one or more completion operations being performed. One such completion operation may be a hydraulic fracturing operation, in which a liquid is pumped into a wellbore to contact the geologic formation and generate fractures throughout the formation due to a pressure of the pumped liquid (e.g., that is greater than a fracture pressure of the rock formation). In some cases, an understanding of a size or other characteristics of the generated hydraulic fractures may be helpful in understanding a potential hydrocarbon production from the geologic formation.

SUMMARY

In a general implementation according to the present disclosure, a structured data processing system for determining a hydraulic fracture dimension includes one or more hardware processors and a memory in communication with the one or more hardware processors. The memory stores a data structure and an execution environment. The data structure stores data that includes a plurality of pressure signal values of a first fracturing fluid in a monitor wellbore formed from a terranean surface into a subsurface formation. The first fracturing fluid is in direct fluid communication with a first hydraulic fracture formed from the monitor wellbore into the subsurface formation. Each of the plurality of pressure signal values includes a pressure change in the first fracturing fluid that is induced by formation of a second hydraulic fracture from a treatment wellbore in the subsurface formation. The second hydraulic fracture is formed by a second fracturing fluid in the treatment wellbore. The execution environment includes a fracture growth solver, a user interface module, and a transmission module. The execution environment is configured to perform operations including determining a particular pressure signal value of the plurality of pressure signal values; based on the determined particular pressure signal value, determining a particular dimension of the second hydraulic fracture formed from the treatment wellbore; and determining, based at least in part on (i) the determined particular dimension, and (ii) a first pressure signal value of the plurality of pressure signal values that is less than the determined particular pressure signal value, a first intermediate dimension of the second hydraulic fracture that is less than the determined particular dimension of the second hydraulic fracture. The user interface module generates a user interface that renders one or more graphical representations of the determined first intermediate dimension of the second hydraulic fracture. The a transmission module that transmits, over one or more communication protocols and to a computing device, data that represents the one or more graphical representations.

In an aspect combinable with the general implementation, the particular dimension includes at least one of a half-length of the second hydraulic fracture, a height of the second hydraulic fracture, or an area of the second hydraulic fracture.

In another aspect combinable with any of the previous aspects, the fracture growth solver is configured to perform operations further including identifying a first fracture stage group of the treatment wellbore that includes a set of hydraulic fractures formed from the treatment wellbore, the set of hydraulic fractures including the second hydraulic fracture formed from the treatment wellbore.

In another aspect combinable with any of the previous aspects, the fracture growth solver is configured to perform operations further including minimizing an error inequality that includes a ratio of the determined fluid pressure and the determined particular pressure signal value; and determining, based on the minimized error inequality, a common dimension of each of the hydraulic fractures in the set of hydraulic fractures formed from the treatment wellbore.

In another aspect combinable with any of the previous aspects, the fracture growth solver is configured to perform operations further including determining, based on the minimized error inequality, a dimension of the first hydraulic fracture and a dimension between the first hydraulic fracture and the set of hydraulic fractures formed from the treatment wellbore.

In another aspect combinable with any of the previous aspects, the error inequality includes a penalty function.

In another aspect combinable with any of the previous aspects, the fracture growth solver is configured to perform operations further including determining the particular dimension of the second hydraulic fracture formed from the treatment wellbore based at least in part on a deviation of the particular dimension from the common dimension of each of the hydraulic fractures in the set of hydraulic fractures formed from the treatment wellbore.

In another aspect combinable with any of the previous aspects, the operation of determining the particular dimension of the second hydraulic fracture formed from the treatment wellbore further includes perturbing a plurality of values of the particular dimension of the second hydraulic fracture as a function of the dimension of the first hydraulic fracture and the dimension between the first hydraulic fracture and the set of hydraulic fractures formed from the treatment wellbore.

In another aspect combinable with any of the previous aspects, the operation of perturbing the plurality of values of the particular dimension of the second hydraulic fracture includes determining an optimal value of the particular dimension based on a numerical model that includes the plurality of values of the particular dimension of the second hydraulic fracture; the plurality of values of the dimension of the first hydraulic fracture; and the dimension between the first hydraulic fracture and the set of hydraulic fractures formed from the treatment wellbore.

In another aspect combinable with any of the previous aspects, the intermediate dimension includes at least one of an intermediate half-length of the second hydraulic fracture, an intermediate height of the second hydraulic fracture, or an intermediate area of the second hydraulic fracture.

In another aspect combinable with any of the previous aspects, the fracture growth solver is configured to perform operations further including determining, based at least in part on (i) the determined particular dimension, and (ii) a second pressure signal value of the plurality of pressure signal values that is less than the determined particular pressure signal value, a second intermediate dimension of the second hydraulic fracture that is less than the determined particular dimension of the second hydraulic fracture.

In another aspect combinable with any of the previous aspects, the fracture growth solver is configured to perform operations further including generating a fracture growth curve of the second hydraulic fracture based on the first and second intermediate dimensions and the determined particular dimension.

In another aspect combinable with any of the previous aspects, the fracture growth solver is configured to perform operations further including generating a fracture growth curve of the second hydraulic fracture based on a continuum that includes the first and second intermediate dimensions and the determined particular dimension.

In another aspect combinable with any of the previous aspects, the fracture growth solver is configured to perform operations further including determining additional intermediate dimensions of the second hydraulic fracture based on the generated fracture growth curve.

In another aspect combinable with any of the previous aspects, the fracture growth solver is configured to perform operations further including graphically presenting the generated fracture growth curve to a user.

In another aspect combinable with any of the previous aspects, the fracture growth solver is configured to perform operations further including determining, based on the generated fracture growth curve, at least one hydraulic fracturing operation action. The user interface module is configured to generate a user interface that renders one or more graphical representations of the at least one hydraulic fracturing operation action. The transmission module is configured to transmit, over the one or more communication protocols and to the computing device, data that represents the one or more graphical representations of the at least one hydraulic fracturing operation action.

In another aspect combinable with any of the previous aspects, the at least one hydraulic fracturing operation action includes at least one of an action that adjusts a viscosity of the second fracturing fluid pumped to the treatment wellbore; an action that adjusts a proppant concentration in the second fracturing fluid pumped to the treatment wellbore; an action that adjusts a pumping rate of the second fracturing fluid pumped to the treatment wellbore; or an action that adjusts a diversion schedule for the treatment wellbore.

In another aspect combinable with any of the previous aspects, the at least one hydraulic fracturing operation action includes at least one of an action that adjusts a viscosity of a third fracturing fluid relative to a viscosity of the second fracturing fluid pumped to the treatment wellbore; an action that adjusts a proppant concentration of the third fracturing fluid relative to a proppant concentration of the second fracturing fluid pumped to the treatment wellbore; an action that adjusts a pumping rate of the third fracturing fluid relative to a pumping rate of the second fracturing fluid pumped to the treatment wellbore; or an action that adjusts a diversion schedule for a third wellbore relative to a diversion schedule for the treatment wellbore.

In another aspect combinable with any of the previous aspects, the particular pressure signal value corresponds to at least one of a shut-in time instant of the treatment wellbore upon a cessation of pumping of the second fracturing fluid into the treatment wellbore; or a maximum pressure of the second fracturing fluid pumped into the treatment wellbore.

In another aspect combinable with any of the previous aspects, the fracture growth solver is configured to perform operations further including normalizing the dimension between the first hydraulic fracture and the set of hydraulic fractures formed from the treatment wellbore in the numerical model to at least one dimensionless value that represents a dimension of the first hydraulic fracture and the set of hydraulic fractures formed from the treatment wellbore.

In another aspect combinable with any of the previous aspects, the dimensionless value is associated with an estimated aspect ratio of the second hydraulic fracture that includes a ratio of a height of the second hydraulic fracture to a half-length of the second hydraulic fracture, an estimated overlap percentage between the first hydraulic fracture and the second hydraulic fracture, and an estimated offset between the first hydraulic fracture and the second hydraulic fracture.

In another aspect combinable with any of the previous aspects, the numerical model includes an N-dimensional hypercube.

In another aspect combinable with any of the previous aspects, the N-dimensional hypercube includes a poromechanical model that describes a poromechanical interaction of the second hydraulic fracture and the first hydraulic fracture.

In another general implementation according to the present disclosure, a computer-implemented method and non-transitory computer readable media for determining a hydraulic fracture dimension include identifying a plurality of pressure signal values of a first fracturing fluid in a monitor wellbore, formed from a terranean surface into a subsurface formation, the first fracturing fluid in direct fluid communication with a first hydraulic fracture formed from the monitor wellbore into the subsurface formation, each of the plurality of pressure signal values including a pressure change in the first fracturing fluid that is induced by formation of a second hydraulic fracture from a treatment wellbore in the subsurface formation, the second hydraulic fracture formed by a second fracturing fluid in the treatment wellbore; determining a particular pressure signal value of the plurality of pressure signal values; based on the determined particular pressure signal value, determining a particular dimension of the second hydraulic fracture formed from the treatment wellbore; determining, based at least in part on (i) the determined particular dimension, and (ii) a first pressure signal value of the plurality of pressure signal values that is less than the determined particular pressure signal value, a first intermediate dimension of the second hydraulic fracture that is less than the determined particular dimension of the second hydraulic fracture; and graphically presenting the determined first intermediate dimension to a user.

In an aspect combinable with the general implementation, the particular dimension includes at least one of a half-length of the second hydraulic fracture, a height of the second hydraulic fracture, or an area of the second hydraulic fracture.

Another aspect combinable with any of the previous aspects further includes identifying a first fracture stage group of the treatment wellbore that includes a set of hydraulic fractures formed from the treatment wellbore.

In another aspect combinable with any of the previous aspects, the set of hydraulic fractures including the second hydraulic fracture formed from the treatment wellbore.

Another aspect combinable with any of the previous aspects further includes minimizing an error inequality that includes a ratio of the determined fluid pressure and the determined particular pressure signal value.

Another aspect combinable with any of the previous aspects further includes determining, based on the minimized error inequality, a common dimension of each of the hydraulic fractures in the set of hydraulic fractures formed from the treatment wellbore.

Another aspect combinable with any of the previous aspects further includes determining, based on the minimized error inequality, a dimension of the first hydraulic fracture and a dimension between the first hydraulic fracture and the set of hydraulic fractures formed from the treatment wellbore.

In another aspect combinable with any of the previous aspects, the error inequality includes a penalty function.

Another aspect combinable with any of the previous aspects further includes determining the particular dimension of the second hydraulic fracture formed from the treatment wellbore based at least in part on a deviation of the particular dimension from the common dimension of each of the hydraulic fractures in the set of hydraulic fractures formed from the treatment wellbore.

In another aspect combinable with any of the previous aspects, determining the particular dimension of the second hydraulic fracture formed from the treatment wellbore further includes perturbing a plurality of values of the particular dimension of the second hydraulic fracture as a function of the dimension of the first hydraulic fracture and the dimension between the first hydraulic fracture and the set of hydraulic fractures formed from the treatment wellbore.

In another aspect combinable with any of the previous aspects, perturbing the plurality of values of the particular dimension of the second hydraulic fracture includes determining an optimal value of the particular dimension based on a numerical model that includes: the plurality of values of the particular dimension of the second hydraulic fracture; the plurality of values of the dimension of the first hydraulic fracture; and the dimension between the first hydraulic fracture and the set of hydraulic fractures formed from the treatment wellbore.

The computer-implemented method of any one of the previous claims, wherein the intermediate dimension includes at least one of an intermediate half-length of the second hydraulic fracture, an intermediate height of the second hydraulic fracture, or an intermediate area of the second hydraulic fracture.

Another aspect combinable with any of the previous aspects further includes determining, based at least in part on (i) the determined particular dimension, and (ii) a second pressure signal value of the plurality of pressure signal values that is less than the determined particular pressure signal value, a second intermediate dimension of the second hydraulic fracture that is less than the determined particular dimension of the second hydraulic fracture.

Another aspect combinable with any of the previous aspects further includes generating a fracture growth curve of the second hydraulic fracture based on the first and second intermediate dimensions and the determined particular dimension.

Another aspect combinable with any of the previous aspects further includes generating a fracture growth curve of the second hydraulic fracture based on a continuum that includes the first and second intermediate dimensions and the determined particular dimension.

Another aspect combinable with any of the previous aspects further includes determining additional intermediate dimensions of the second hydraulic fracture based on the generated fracture growth curve.

Another aspect combinable with any of the previous aspects further includes graphically presenting the generated fracture growth curve to a user.

Another aspect combinable with any of the previous aspects further includes determining, based on the generated fracture growth curve, at least one hydraulic fracturing operation action.

Another aspect combinable with any of the previous aspects further includes graphically presenting the at least one hydraulic fracturing operation action to a user.

In another aspect combinable with any of the previous aspects, the at least one hydraulic fracturing operation action includes at least one of: an action that adjusts a viscosity of the second fracturing fluid pumped to the treatment wellbore; an action that adjusts a proppant concentration in the second fracturing fluid pumped to the treatment wellbore; an action that adjusts a pumping rate of the second fracturing fluid pumped to the treatment wellbore; or an action that adjusts a diversion schedule for the treatment wellbore.

In another aspect combinable with any of the previous aspects, the at least one hydraulic fracturing operation action includes at least one of: an action that adjusts a viscosity of a third fracturing fluid relative to a viscosity of the second fracturing fluid pumped to the treatment wellbore; an action that adjusts a proppant concentration of the third fracturing fluid relative to a proppant concentration of the second fracturing fluid pumped to the treatment wellbore; an action that adjusts a pumping rate of the third fracturing fluid relative to a pumping rate of the second fracturing fluid pumped to the treatment wellbore; or an action that adjusts a diversion schedule for a third wellbore relative to a diversion schedule for the treatment wellbore.

In another aspect combinable with any of the previous aspects, the particular pressure signal value corresponds to at least one of: a shut-in time instant of the treatment wellbore upon a cessation of pumping of the second fracturing fluid into the treatment wellbore; or a maximum pressure of the second fracturing fluid pumped into the treatment wellbore.

Another aspect combinable with any of the previous aspects further includes normalizing the dimension between the first hydraulic fracture and the set of hydraulic fractures formed from the treatment wellbore in the numerical model to at least one dimensionless value that represents dimension of the first hydraulic fracture and the set of hydraulic fractures formed from the treatment wellbore.

In another aspect combinable with any of the previous aspects, the dimensionless value is associated with an estimated aspect ratio of the second hydraulic fracture that includes a ratio of a height of the second hydraulic fracture to a half-length of the second hydraulic fracture, an estimated overlap percentage between the first hydraulic fracture and the second hydraulic fracture, and an estimated offset between the first hydraulic fracture and the second hydraulic fracture.

In another aspect combinable with any of the previous aspects, the numerical model includes an N-dimensional hypercube.

In another aspect combinable with any of the previous aspects, the N-dimensional hypercube includes a poromechanical model that describes a poromechanical interaction of the second hydraulic fracture and the first hydraulic fracture.

Implementations of a hydraulic fracturing modeling system according to the present disclosure may include one, some, or all of the following features. For example, implementations may more accurately determine hydraulic fracture dimensions and generate a hydraulic fracture growth curve, thereby informing a fracture treatment operator about one or more effects of particular treatment parameters. Further, implementations may more accurately determine a proppant area of a hydraulic fracture, thereby increasing the accuracy for hydrocarbon production predictions for treated wells.

Implementations of a hydraulic fracturing modeling system according to the present disclosure may include a system of one or more computers that can be configured to perform particular actions by virtue of having software, firmware, hardware, or a combination of them installed on the system that in operation causes or cause the system to perform the actions. One or more computer programs can be configured to perform particular actions by virtue of including instructions that, when executed by data processing apparatus, cause the apparatus to perform the actions.

The details of one or more implementations of the subject matter described in this disclosure are set forth in the accompanying drawings and the description below. Other features, aspects, and advantages of the subject matter will become apparent from the description, the drawings, and the claims.

BRIEF DESCRIPTION OF DRAWINGS

FIGS. 1A-1C are schematic illustrations of an example implementation of a hydraulic fracturing modeling system within a hydraulic fracturing system.

DETAILED DESCRIPTION

Figure 1A:
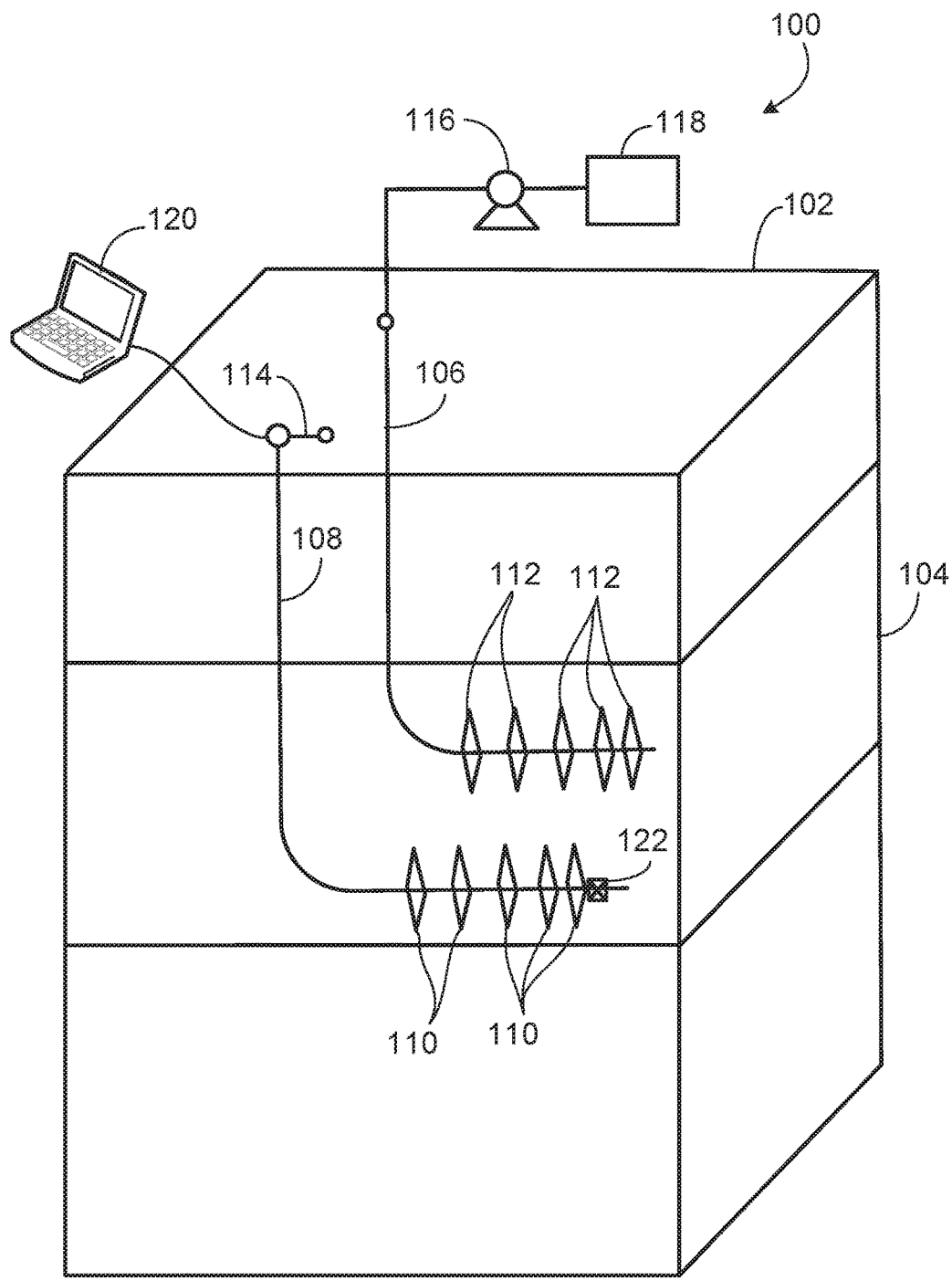
Figure 1B:
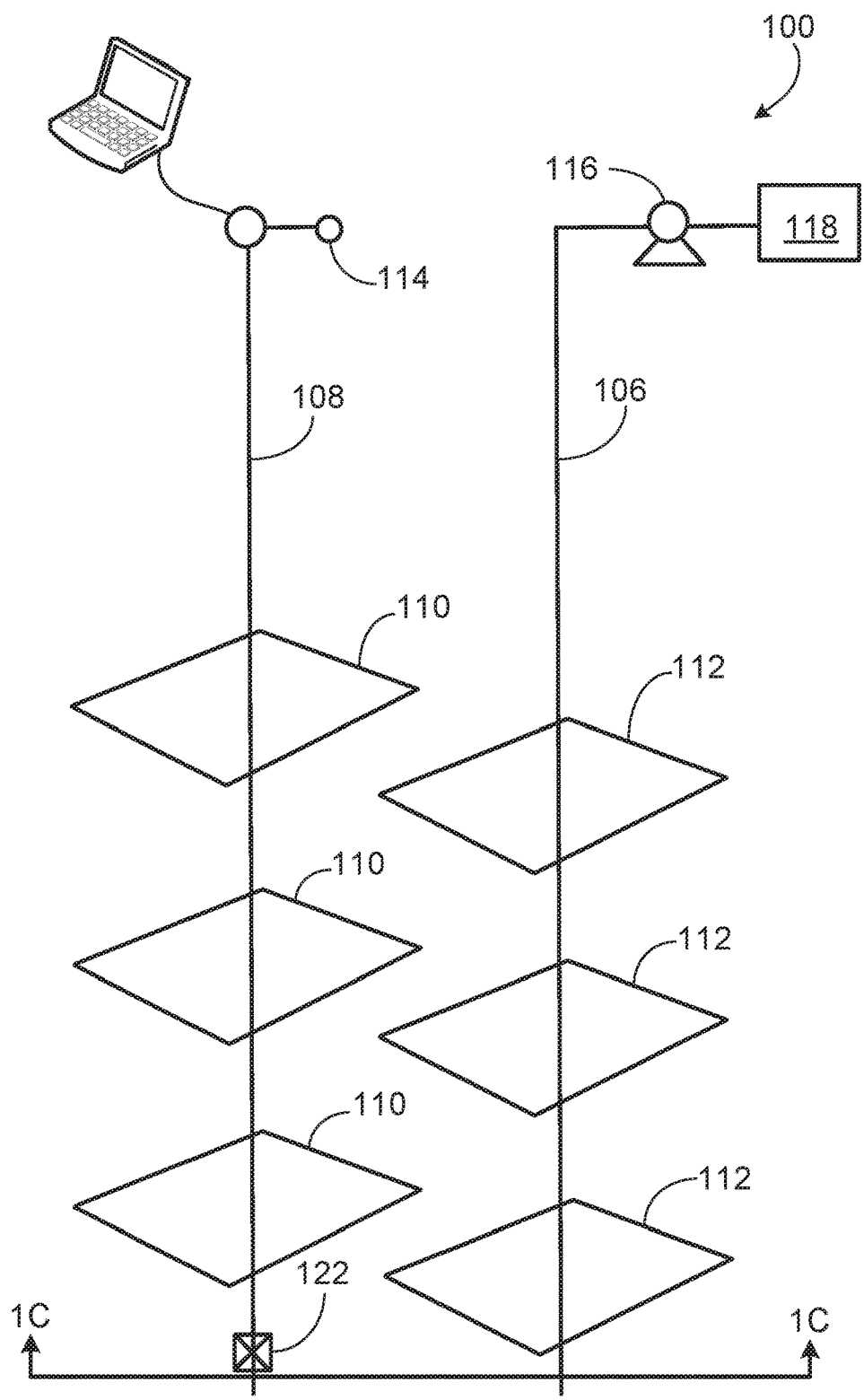

FIGS. 1A-1C are schematic illustrations of an example implementation of a hydraulic fracturing modeling system 120 (a structured data processing system) within a hydraulic fracturing system 100. As shown, system 100 includes a monitor wellbore 108 that is formed from a terranean surface 102 to a subterranean zone 104 located below the terranean surface 102. The monitor wellbore 108, generally, includes a plug 122 or other fluid barrier positioned in the wellbore 108, and a pressure sensor 114. In this example, the pressure sensor 114 is located at or near a wellhead on the monitor wellbore 108 but in alternate implementations, the pressure sensor 114 may be positioned within the monitor wellbore 108 below the terranean surface 102. Generally, according to the present disclosure, the monitor wellbore 108 may be used to measure pressure variations in a fluid contained in the wellbore 108 and/or one or more hydraulic fractures 110 formed from the monitor wellbore 108 that are induced by a hydraulic fracturing fluid pumped into a treatment wellbore 106 to form one or more hydraulic fractures 112 formed from the treatment wellbore 106. Such induced pressure variations, as explained more fully below, may be used to determine a fracture growth curve and other information regarding the hydraulic fractures 112.

The monitor wellbore 108 shown in FIG. 1A includes vertical and horizontal sections, as well as a radiussed section that connects the vertical and horizontal portions. Generally, and in alternative implementations, the wellbore 108 can include horizontal, vertical (e.g., only vertical), slant, curved, and other types of wellbore geometries and orientations. The wellbore 108 may include a casing (not shown) that is cemented or otherwise secured to the wellbore wall to define a borehole in the inner volume of the casing. In alternative implementations, the wellbore 108 can be uncased or include uncased sections. Perforations (not specifically labeled) can be formed in the casing to allow fracturing fluids and/or other materials to flow into the wellbore 108. Perforations can be formed using shape charges, a perforating gun, and/or other tools. Although illustrated as generally vertical portions and generally horizontal portions, such parts of the wellbore 108 may deviate from exactly vertical and exactly horizontal (e.g., relative to the terranean surface 102) depending on the formation techniques of the wellbore 108, type of rock formation in the subterranean formation 104, and other factors. Generally, the present disclosure contemplates all conventional and novel techniques for forming the wellbore 108 from the surface 102 into the subterranean formation 104.

The treatment wellbore 106 shown in FIG. 1A includes vertical and horizontal sections, as well as a radiussed section that connects the vertical and horizontal portions. Generally, and in alternative implementations, the wellbore 106 can include horizontal, vertical (e.g., only vertical), slant, curved, and other types of wellbore geometries and orientations. The treatment wellbore 106 may include a casing (not shown) that is cemented or otherwise secured to the wellbore wall to define a borehole in the inner volume of the casing. In alternative implementations, the wellbore 106 can be uncased or include uncased sections. Perforations (not specifically labeled) can be formed in the casing to allow fracturing fluids and/or other materials to flow into the wellbore 106. Perforations can be formed using shape charges, a perforating gun, and/or other tools. Although illustrated as generally vertical portions and generally horizontal portions, such parts of the wellbore 106 may deviate from exactly vertical and exactly horizontal (e.g., relative to the terranean surface 102) depending on the formation techniques of the wellbore 106, type of rock formation in the subterranean formation 104, and other factors. Generally, the present disclosure contemplates all conventional and novel techniques for forming the wellbore 106 from the surface 102 into the subterranean formation 104. Generally, according to the present disclosure, the treatment wellbore 106 is used to form one or more hydraulic fractures 112 that can produce or enhance production of hydrocarbons or other fluids in the subterranean zone 104. A hydraulic fracturing fluid used to form such fractures 112, during formation of the fractures 112, may induce pressure variations in a fluid contained in the monitor wellbore 108, which may be used to determine a fracture growth curve and other information regarding the hydraulic fractures 112.

Although a single monitor wellbore 108 and a single treatment wellbore 106 are shown in FIGS. 1A-1C, the present disclosure contemplates that the system 100 may include multiple (e.g., more than 2) wellbores, any of which may be assigned as a "monitor" wellbore or a "treatment" wellbore. For example, in some aspects, there may be multiple (e.g., 10 or more) wellbores formed into the subterranean zone 104, with a single wellbore assigned to be the monitor wellbore and the remaining wellbores assigned to be treatment wellbores. Alternatively, there may be multiple monitor wellbore and multiple treatment wellbores within a set of wellbores formed into the subterranean zone. Further, in some aspects, one or more wellbores in a set of wellbores formed into the subterranean zone 104 may be initially designated as monitor wellbores while one or more other wellbores may be designated as treatment wellbores. Such initial designations, according to the present disclosure, may be adjusted over time such that wellbores initially designated monitor wellbores may be re-designated as treatment wellbores while wellbores initially designated treatment wellbores may be re-designated as monitor wellbores.

The example hydraulic fracturing system 100 includes a hydraulic fracturing liquid circulation system 118 that is fluidly coupled to the treatment wellbore 106. In some aspects, the hydraulic fracturing liquid circulation system 118, which includes one or more pumps 116, is fluidly coupled to the subterranean formation 104 (which could include a single formation, multiple formations or portions of a formation) through a working string (not shown). Generally, the hydraulic fracturing liquid circulation system 118 can be deployed in any suitable environment, for example, via skid equipment, a marine vessel, sub-sea deployed equipment, or other types of equipment and include hoses, tubes, fluid tanks or reservoirs, pumps, valves, and/or other suitable structures and equipment arranged to circulate a hydraulic fracturing liquid through the treatment wellbore 106 and into the subterranean formation 104 to generate the one or more fractures 112. The working string is positioned to communicate the hydraulic fracturing liquid into the treatment wellbore 106 and can include coiled tubing, sectioned pipe, and/or other structures that communicate fluid through the wellbore 106. The working string can also include flow control devices, bypass valves, ports, and or other tools or well devices that control the flow of fracturing fluid from the interior of the working string into the subterranean formation 104.

Although labeled as a terranean surface 102, this surface may be any appropriate surface on Earth (or other planet) from which drilling and completion equipment may be staged to recover hydrocarbons from a subterranean zone. For example, in some aspects, the surface 102 may represent a body of water, such as a sea, gulf, ocean, lake, or otherwise. In some aspects, all are part of a drilling and completion system, including hydraulic fracturing system 100, may be staged on the body of water or on a floor of the body of water (e.g., ocean or gulf floor). Thus, references to terranean surface 102 includes reference to bodies of water, terranean surfaces under bodies of water, as well as land locations.

Subterranean formation 104 includes one or more rock or geologic formations that bear hydrocarbons (e.g., oil, gas) or other fluids (e.g., water) to be produced to the terranean surface 102. For example, the rock or geologic formations can be shale, sandstone, or other type of rock, typically, that may be hydraulically fractured to produce or enhance production of such hydrocarbons or other fluids.

As shown specifically in FIG. 1C, the monitor fractures 110 emanating from the monitor wellbore 108 and the treatment fractures 112 emanating from the treatment wellbore 106 may extend past each other (e.g., overlap in one or two dimensions) when formed. In some aspects, data about the location of such fractures 110 and 112 and their respective wellbores 108 and 106, such as locations of the wellbores, distances between the wellbores (e.g., in three dimensions) depth of horizontal portions of the wellbores, and locations of the hydraulic fractures initiated from the wellbores (e.g., based on perforation locations formed in the wellbores), among other information. In some aspects, such information (along with the monitored, induced pressure variations in a fluid in the one or more monitor wellbores) may be used to help determine one or more dimensions (e.g., fracture length, fracture half-length, fracture height, fracture area) of the hydraulic fractures 112.

Figure 2:
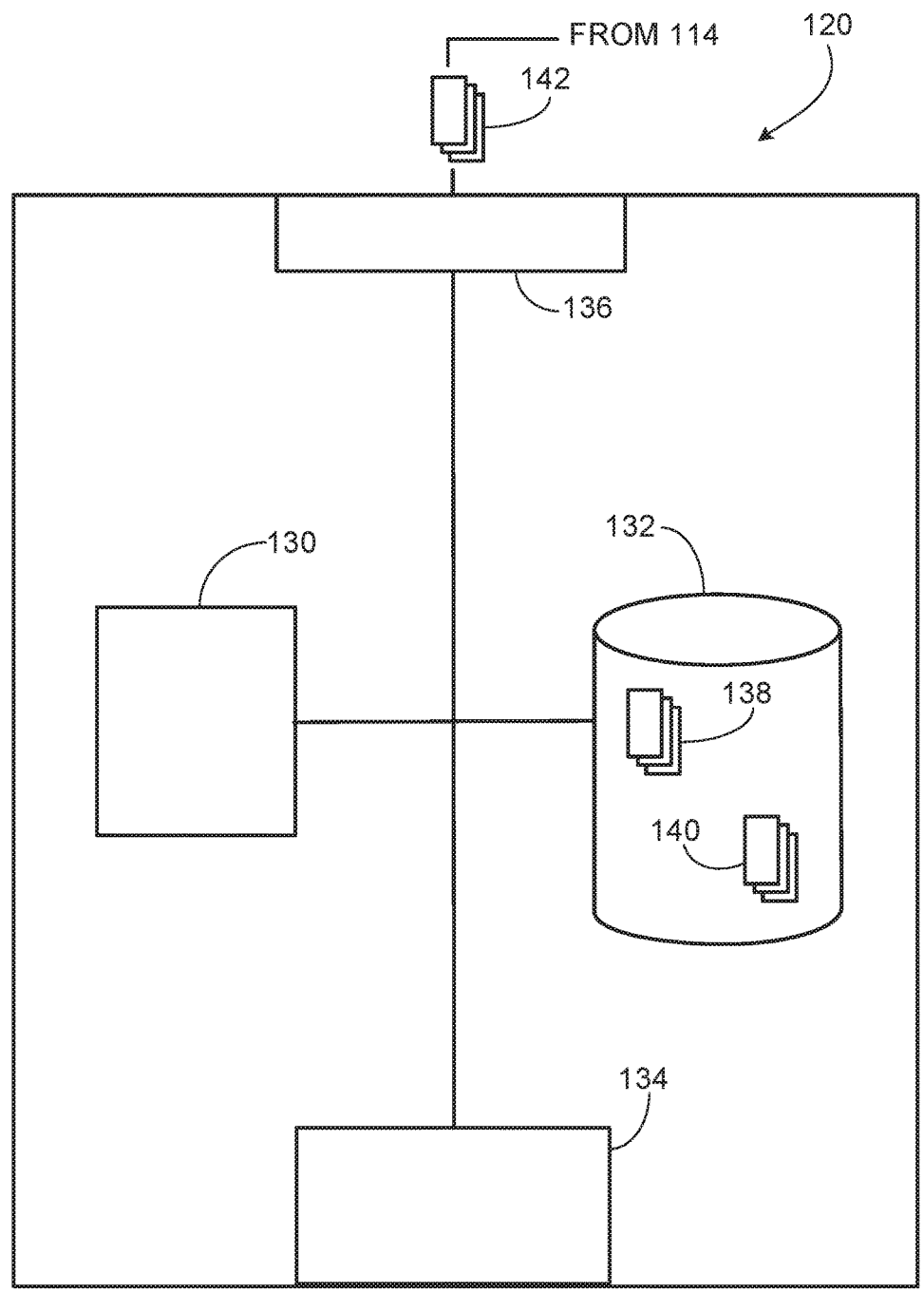
FIG. 2 is a schematic diagram of a structured data processing system that implements the hydraulic fracturing modeling system.

FIG. 2 is a schematic diagram of a computing system that implements the hydraulic fracturing modeling system 120 (structured data processing system) shown in FIGS. 1A-1C. Generally, the hydraulic fracturing modeling system 120 includes a processor-based control system operable to implement one or more operations described in the present disclosure. As shown in FIG. 2, pressure signal values 142 may be received at the hydraulic fracturing modeling system 120 from the pressure sensor 114 that is fluidly coupled to or in the monitor wellbore 108. The pressure signal values 142, in some aspects, may represent pressure variations in a fluid that is enclosed or contained in the monitor wellbore 108 and/or the hydraulic fractures 110 that are induced by a hydraulic fracturing fluid being used to form hydraulic fractures 112 from the treatment wellbore 106.

The hydraulic fracturing modeling system 120 may be any computing device operable to receive, transmit, process, and store any appropriate data associated with operations described in the present disclosure. The illustrated hydraulic fracturing modeling system 120 includes hydraulic fracturing modeling application 130. The application 130 is any type of application that allows the hydraulic fracturing modeling system 120 to request and view content on the hydraulic fracturing modeling system 120. In some implementations, the application 130 can be and/or include a web browser. In some implementations, the application 130 can use parameters, metadata, and other information received at launch to access a particular set of data associated with the hydraulic fracturing modeling system 120. Further, although illustrated as a single application 130, the application 130 may be implemented as multiple applications in the hydraulic fracturing modeling system 120.

The illustrated hydraulic fracturing modeling system 120 further includes an interface 136, a processor 134, and a memory 132. The interface 136 is used by the hydraulic fracturing modeling system 120 for communicating with other systems in a distributed environment—including, for example, the pressure sensor 114—that may be connected to a network. Generally, the interface 136 comprises logic encoded in software and/or hardware in a suitable combination and operable to communicate with, for instance, the pressure sensor 114, a network, and/or other computing devices. More specifically, the interface 136 may comprise software supporting one or more communication protocols associated with communications such that a network or interface's hardware is operable to communicate physical signals within and outside of the hydraulic fracturing modeling system 120.

Regardless of the particular implementation, "software" may include computer-readable instructions, firmware, wired or programmed hardware, or any combination thereof on a tangible medium (transitory or non-transitory, as appropriate) operable when executed to perform at least the processes and operations described herein. Indeed, each software component may be fully or partially written or described in any appropriate computer language including C, C++, Java, Visual Basic, ABAP, assembler, Perl, Python, .net, Matlab, any suitable version of 4GL, as well as others. While portions of the software illustrated in FIG. 2 are shown as individual modules that implement the various features and functionality through various objects, methods, or other processes, the software may instead include a number of sub-modules, third party services, components, libraries, and such, as appropriate. Conversely, the features and functionality of various components can be combined into single components as appropriate.

The processor 134 executes instructions and manipulates data to perform the operations of the hydraulic fracturing modeling system 120. The processor 134 may be a central processing unit (CPU), a blade, an application specific integrated circuit (ASIC), a field-programmable gate array (FPGA), or another suitable component. Generally, the processor 134 executes instructions and manipulates data to perform the operations of the hydraulic fracturing modeling system 120.

Although illustrated as a single memory 132 in FIG. 2, two or more memories may be used according to particular needs, desires, or particular implementations of the hydraulic fracturing modeling system 120. In some implementations, the memory 132 is an in-memory database. While memory 132 is illustrated as an integral component of the hydraulic fracturing modeling system 120, in some implementations, the memory 132 can be external to the hydraulic fracturing modeling system 120. The memory 132 may include any memory or database module and may take the form of volatile or non-volatile memory including, without limitation, magnetic media, optical media, random access memory (RAM), read-only memory (ROM), removable media, or any other suitable local or remote memory component. The memory 132 may store various objects or data, including classes, frameworks, applications, backup data, business objects, jobs, web pages, web page templates, database tables, repositories storing business and/or dynamic information, and any other appropriate information including any parameters, variables, algorithms, instructions, rules, constraints, or references thereto associated with the purposes of the hydraulic fracturing modeling system 120.

The illustrated hydraulic fracturing modeling system 120 is intended to encompass any computing device such as a desktop computer, laptop/notebook computer, wireless data port, smart phone, smart watch, wearable computing device, personal data assistant (PDA), tablet computing device, one or more processors within these devices, or any other suitable processing device. For example, the hydraulic fracturing modeling system 120 may comprise a computer that includes an input device, such as a keypad, touch screen, or other device that can accept user information, and an output device that conveys information associated with the operation of the hydraulic fracturing modeling system 120 itself, including digital data, visual information, or a GUI.

As illustrated in FIG. 2, the memory 132 stores structured data, including one or more poromechanical models 138. In some aspects, a poromechanical model 138 may be in the form of an N-dimensional hypercube that describes poromechanical interactions between the hydraulic fractures 110 and the hydraulic fractures 112. The poromechanical interactions may be identified using pressure signals measured by the pressure sensor 114 of a fluid contained in the monitor wellbore 108 or the hydraulic fractures 110. The poromechanical interactions may also be identified using one or more pressure sensors or other components that measure a pressure of a hydraulic fracturing fluid used to form the hydraulic fractures 112 from the treatment wellbore 106. In certain embodiments, the pressure signals include a pressure versus time curve of the pressure signal. Pressure-induced poromechanic signals may be identified in the pressure versus time curve and the pressure-induced poromechanic signals may be used to assess one or more parameters (e.g., geometry) of the hydraulic fractures 112. As used herein, a "pressure-induced poromechanic signal" refers to a recordable change in pressure of a first fluid in direct fluid communication with a pressure sensor (e.g., pressure gauge) where the recordable change in pressure is caused by a change in stress on a solid in a subsurface formation that is in contact with a second fluid (e.g., a hydrocarbon fluid), which is in direct fluid communication with the first fluid. The change in stress of the solid may be caused by a third fluid used in a hydraulic stimulation process (e.g., a hydraulic fracturing process) in a treatment wellbore 106 in proximity to (e.g., adjacent) the observation (monitoring) wellbore with the third fluid not being in direct fluid communication with the second fluid.

For example, a pressure-induced poromechanic signal may occur in the pressure sensor 114 attached to the wellhead of the monitor wellbore 108, where at least one stage of that monitor wellbore 108 has already been hydraulically fractured to create the fractures 110 (assumed, for this example, to be part of a common fracturing stage), when the adjacent treatment wellbore 106 undergoes hydraulic stimulation. A particular hydraulic fracture 112 emanating from the treatment wellbore 106 may grow in proximity to the fracture 110 but these fractures do not intersect. No fluid from the hydraulic fracturing process in the treatment wellbore 106 contacts any fluid in the hydraulic fractures 110 and no measurable pressure change in the fluid in the hydraulic fractures 110 is caused by advective or diffusive mass transport related to the hydraulic fracturing process in the treatment wellbore 106. Thus, the interaction of the fluids in the hydraulic fracture 112 with fluids in the subsurface matrix does not result in a recordable pressure change in the fluids in the fracture 110 that can be measured by the pressure sensor 114. The change in stress on a rock (in the subterranean zone 104) in contact with the fluids in the fracture 112, however, may cause a change in pressure in the fluids in the fracture 110, which can be measured as a pressure-induced poromechanic signal in the pressure sensor 114.

Poromechanic signals may be present in traditional pressure measurements taken in the monitor wellbore 108 while fracturing the treatment wellbore 106. For example, if a newly formed hydraulic fracture 112 overlaps or grows in proximity to a particular hydraulic fracture 110 in fluid communication with the pressure sensor 114 in the monitor wellbore 108, one or more poromechanic signals may be present. However, poromechanic signals may be smaller in nature than a direct fluid communication signal (e.g., a direct pressure signal induced by direct fluid communication such as a direct fracture hit or fluid connectivity through a high permeability fault). Poromechanic signals may also manifest over a different time scale than direct fluid communication signals. Thus, poromechanic signals are often overlooked, unnoticed, or disregarded as data drift or error in the pressure sensor 114. However, such signals may be used, at least in part, to determine a fracture growth curve and other associated fracture dimensions of the hydraulic fractures 112 that emanate from the treatment wellbore 106.

Figure 4A:
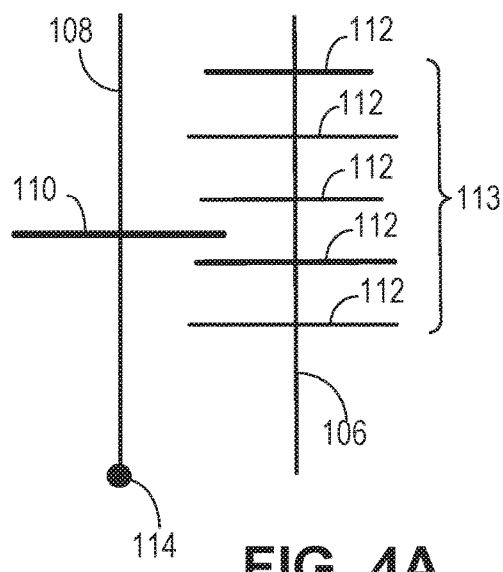
FIGS. 4A-4C are schematic illustrations of a monitor wellbore and a treatment wellbore with multiple hydraulic fractures within a hydraulic fracturing stage.

Turning briefly to FIG. 4A, this figures shows a schematic view of the system 100 in which a hydraulic fracturing stage 113 is shown to include multiple hydraulic fractures 112 from the treatment wellbore 106. A single hydraulic fracture 110 (which also is part of a hydraulic fracturing stage with multiple fractures, not shown) is illustrated in this figure. In some aspects, the poromechanical model 138 comprises numerical model that calculates a gain, K, for each combination of a monitor stage fracture (fracture 110), i, and a fractured stage, j, according to:

$$K_{ij} = f(\tilde{D}_m^i, \tilde{D}_f^j, \vec{X}_{ij})$$  Eq. (1)

where $D_m$ and $D_f$ are the dimensions of the hydraulic fracture 110 and the fractured stage 113, respectively, and i ranges over the number of hydraulic fractures 112 in a particular stage of hydraulic fractures 112 from the monitor wellbore 108, and j ranges over the number of stages 113 that are completed. The vector, $X_{ij} \in R^3$, connects a perforation location, j, for a particular stage 113 of hydraulic fractures 112 and a perforation location, i, of the hydraulic fracture 110. This vector is approximately known since each relative position of all perforation locations (in both the monitor wellbore 108 and the treatment wellbore 106) is specified. Thus, only a combination of which locations (in the monitor wellbore 108 and the treatment wellbore 106) need be solved for to determine the gain, K, of that combination, ij. Further, the tilde underneath the dimensions, D, indicates that a "dimension" may include a set of geometry attributes such as fracture half-length on both sides of a wellbore, fracture height, fracture azimuth, vertical asymmetry with respect to wellbore, and fracture shape, rather than a single "dimension."

The function, $f$, in Eq. 1 relies on the poromechanical model 138 as well as one or more normalized dimensions (that may be part of the model 138 or separate from the model 138). For example, the normalized dimensions include a dimension between the hydraulic fracture 110 and the set of hydraulic fractures 112 formed from the treatment wellbore 106. The normalized dimension includes a dimensionless value that is associated with an aspect ratio of a height of the hydraulic fracture 112 to a half-length of the hydraulic fracture 112. The dimensionless value may also be associated with an estimated overlap percentage between the hydraulic fracture 110 and the hydraulic fracture 112 (e.g., as shown in FIG. 1C). The dimensionless value may also be associated with an estimated offset between the hydraulic fracture 110 and the second hydraulic fracture 112.

Besides the spatial information and the geometry information of the fractures 110 and 112, there is also sequence/time data in the numerical model. In some examples, this timing information is captured by the Boolean function:

$$\tau_{ij} = \begin{cases} 1 & \text{for } t_i^{start} < t_j^{frac} < t_i^{stop} \\ 0 & \text{for other} \end{cases}$$  Eq. 2 where $\tau_{ij}$ equals one only when a fracture j is being treated (fracturing time: $t_j^{frac}$) during the "lifetime" of monitor, I, bounded by its start, $t_i^{start}$ and stop time $t_i^{stop}$. When the monitor is "not live" during the fracturing of a stage, $\tau_{ij}$ equal zero.

The gain, K, may be obtained through pressure signals received from the pressure sensor 114 as well as a net pressure measured for fracturing the hydraulic fracture stage 113. For example, from field measurements (such as those described), the measured gain value is obtained, which equals a ratio of the $\Delta P_{ij}$ observed by monitor, i, during fracturing of stage, j (i.e., an observation) and the net pressure, $P_{net}^j$, measured for fracturing of stage, j. Thus, the calculated gain, $K_{ij}$, can be set equal to the measured gain value:

$$K_{ij}\tau_{ij} = \frac{\Delta P_{ij}}{P_{net}^j} + \omega.$$  Eq. 3

Here, unknown values on the right hand side of Eq. 3 (the measured gain value) are monitor fracture (110) dimensions, D'm, treatment fracture (112) dimensions, $D^j{}_f$, and the perforation location vector. The fluctuation value, ω, captures all errors arising from model assumptions (in $K_{ij}$) and field measurement variability $$\left( \text{in } \frac{\Delta P_{ij}}{P_{net}^j} \right).$$

In some aspects, the value of ω may determine the accuracy of measured gain. In some aspects, an assumption that ω may be small (e.g., approaching zero) and therefor negligible may be made.

Figure 3:
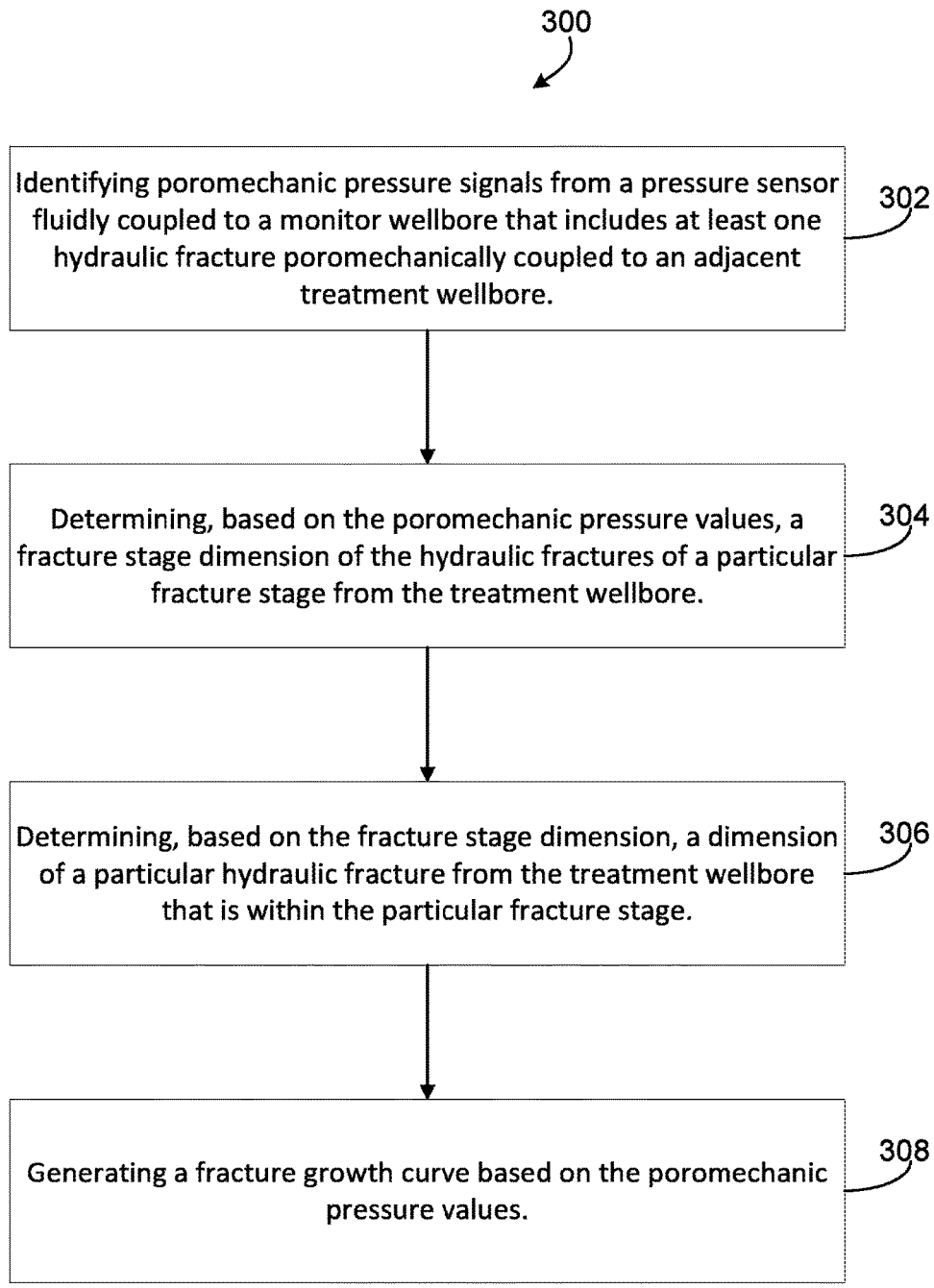
FIG. 3 is a flowchart that describes an example method for determining a hydraulic fracture growth curve with a hydraulic fracturing modeling system.

FIG. 3 is a flowchart that describes an example method 300 for determining a hydraulic fracture growth curve with the hydraulic fracturing modeling system 120, using the poromechanical model 138. For example, method 300 may begin at step 302, which includes identifying poromechanic pressure signals from a pressure sensor fluidly coupled to a monitor wellbore that includes at least one hydraulic fracture poromechanically coupled to an adjacent treatment wellbore.

Figure 4B:
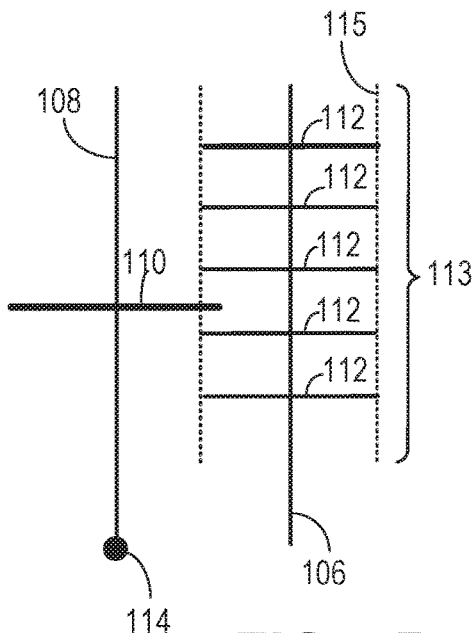

Method 300 may continue at step 304, which includes determining, based on the poromechanic pressure values, a fracture stage dimension of the hydraulic fractures of a particular fracture stage from the treatment wellbore. For example, in step 304, a determination of a common, or representative, dimension of all of the hydraulic fractures in a particular fracture stage is made. Turning briefly to FIG. 4B, for example, the determined common dimension (e.g., fracture half-length) 115 is calculated and assumed (in this step) to be the same value for each of the hydraulic fractures 112 that emanate from the treatment wellbore 106.

In some aspects, for example, the fracture stage 113 may be assumed to have multiple hydraulic fractures 112 that were formed through similar, if not identical, fracture treatments (e.g., based on pump rates and pressure, time of fracture operation, viscosity and proppant mixture of fracturing fluid, and otherwise). Thus, this assumption leads to the assumption that each hydraulic fracture 112 in stage 113 may have similar, final dimensions. In step 304 of method 300, the fracture dimensions of a stage group, n (e.g., stage group 113) is referred to by $D^n{}_G$, yielding:

$$D_f^j = D_G^{n(j)} \qquad \text{Eq. 4}$$

where n(j) implies that a stage j is uniquely assigned to a single stage group n. If the number of stage groups, N, is smaller than the number of fractured stages J (N<J), then the number of degrees of freedom from our fractured stage dimensions $D^i{}_f$ is reduced by a fraction of J/N.

In some aspects, the solution space may be constrained by constraining the vector, $X_{ij}$, to a finite number of discrete values (e.g., rather than a continuous variable) governed by the (discrete) cluster locations in the monitor stage and the treatment stage. Also, there may be limiting factors for the ranges of the fracture dimensions, for example a known formation barrier (e.g., between the subterranean zone 104 and the terranean surface 102) that constrains a height of the fractures 112.

In some aspects, there may be fractured stage dimensions that remain unconstrained (or very poorly conditioned). For example, in cases where there is a large amount of time between stage fracturing, or between fracturing of the monitor wellbore 108 and the treatment wellbore 106, or a large distance between the fractures 110 and the fractures 112, these fractured stages may be removed from the system and will not be mapped. This also applies to monitor stages. For example, if a monitor stage didn't make any or an insufficient number of observations, the monitor dimensions for that particular monitor stage may remain unresolved.

In step 304, assuming ω=0 from Eq. 3 and including the degree of freedom reduction from Eq. 4 yields:

$$K_{ij}\left(D_f^j, \sim\right)\tau_{ij} = \frac{\Delta P_{ij}}{P_{net}^j} \rightarrow K_{ij}\left(D_G^{n(j)}, \sim\right)\tau_{ij} \approx \frac{\Delta P_{ij}}{P_{net}^j}. \qquad \text{Eq. 5}$$

This system may be solved by minimizing an overall error posed by the inequality of Eq. 5 by minimizing an error function, £, arising from the inequality:

$$E = \min \sum_i \sum_j \omega_{ij}\epsilon_{ij} \text{ with} \qquad \text{Eq. 6}$$

$$\epsilon_{ij} = \epsilon(K_{ij}\tau_{ij}, \Delta P_{ij}/P_{net}^j).$$

Figure 4C:
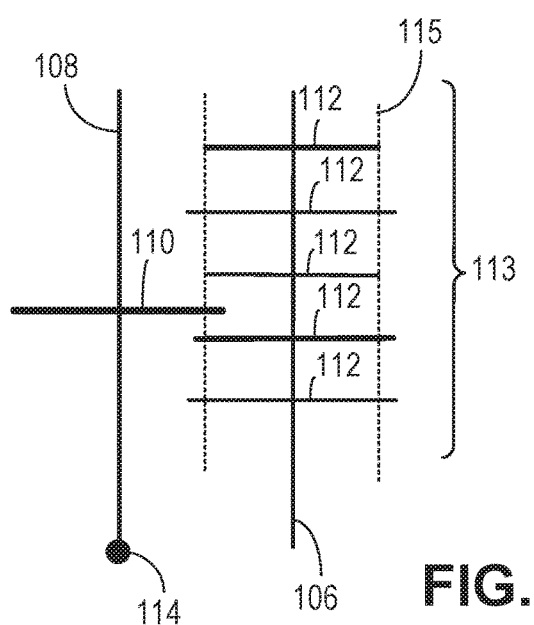
Figure 4D:
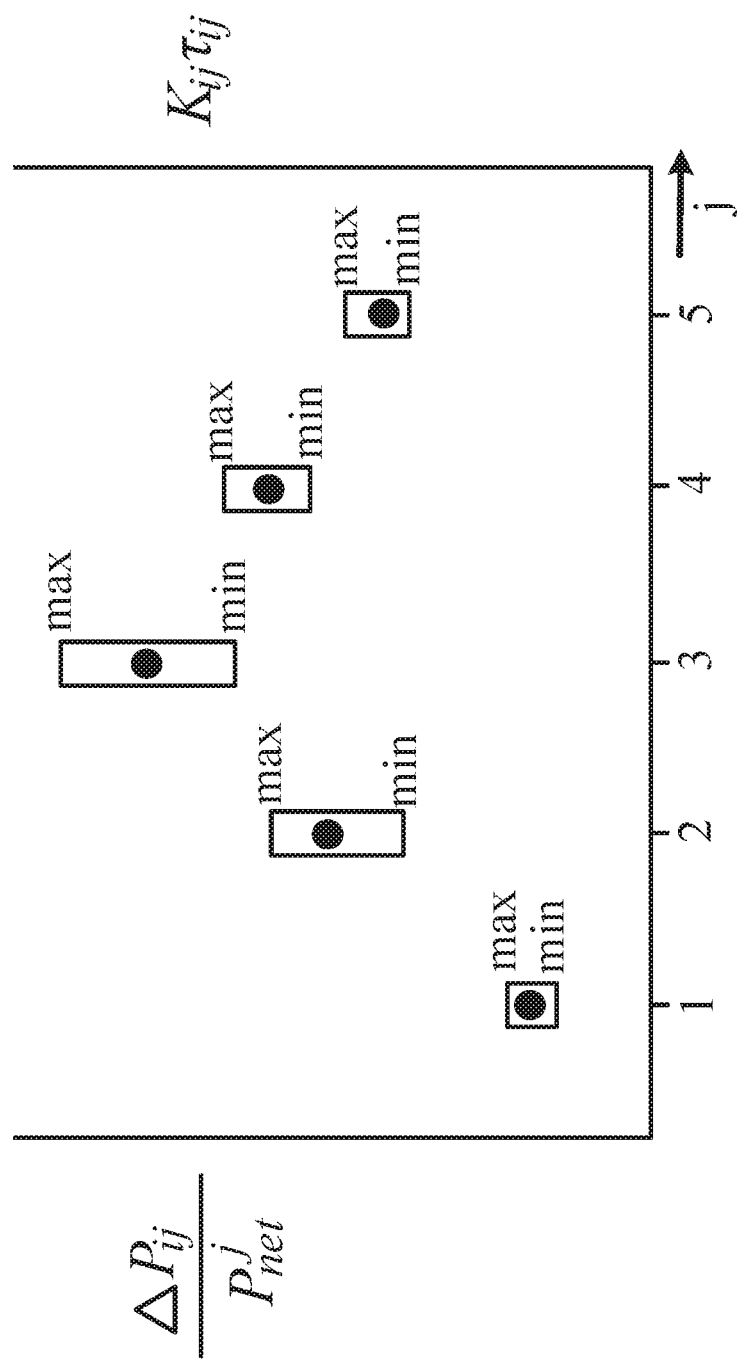
FIG. 4D illustrates a graph that shows results of minimizing the error space for multiple fracturing stages of a treatment wellbore of the hydraulic fracturing system.

In Eq. 6, $w_{ij}$ is the weight factor of the individual error. In some aspects, minimizing the error space may be algorithmically executed or executed algorithmically and with human intelligence (e.g., to analyze and interpret the impact of the error $\varepsilon_{ij}$ on the overall solution. The penalty factor $w_{ij}$ may be used to set the weight factor for a certain error (or observation). This value can be automatically set by algorithms or can be overwritten by an analyst based on experience. Turning briefly to FIG. 4D, this graph illustrates the results of minimizing the error space for multiple fracturing stages (1 . . . j) of the treatment wellbore 106. As shown, there may be a maximum and minimum determined value of the gain, $K_{ij}$, for each stage that results from the error minimization.

The final global solution resulting from step 304 includes a determination of the monitor fracture dimension (e.g., of fracture 110), $D^i{}_m$; the common or representative dimension 115 of the treatment fracture stage 113 (that included hydraulic fractures 112), and the vector, $X_{ij}$, that represents the relative position of the fractures 110 and 112 in the stage 113 (e.g., as constrained by the discrete perforation locations).

Method 300 may continue at step 306, which includes determining, based on the fracture stage dimension, a dimension of a particular hydraulic fracture from the treatment wellbore that is within the particular fracture stage. For example, in step 306, a determination of a particular dimension (e.g., a maximum dimension) of a particular hydraulic fracture 112 (or each hydraulic fracture 112 if repeated for each particular fracture 112 in the stage 113) is made. Turning briefly to FIG. 4C, for example, each fracture 112 may have a different dimension (e.g., fracture half-length or otherwise) as shown. Step 306 determines the particular, unique dimension of the hydraulic fracture 112.

In some aspects, step 306 includes a perturbation method to determine how much a dimension of an individual hydraulic fracture 112 deviates from the common or representative dimension that is determined in step 304. For example, step 306 includes determining how much an individual fracture dimension, $D^i{}_f$, actually deviates from the overall dimension of the stage, $D^n{}_G(j)$. In some aspects, this may be determined by selecting the best observation(s) (i, j) for a stage j. For that stage j, the equality from Eq. 3 (assuming zero error), by perturbing $D^i{}_f$, while leaving the monitor fracture dimensions, $D^i{}_m$, unaltered. Further, the relative perforation locations, vector $X_{ij}$, may only change by changing the cluster number of the treatment wellbore fracturing stage that is completed (e.g., the cluster number of the monitor wellbore 108 stays fixed).

In some aspects, not all fracture dimension attributes of the stages completed on the treatment wellbore are perturbed. For example, in some aspects, only the fracture half-lengths, $FHL_{ij}$ is used as an independent variable. Thus, in some examples, a fracture height is either kept constant or scaled along with the changing fracture half-length of the particular hydraulic fracture 112. In some aspects, the fracture cluster may be varied as well, in order to satisfy the equality. Thus, step 306 may determine a localized (e.g., for a particular hydraulic fracture 112) dimension.

Method 300 may continue at step 308, which includes generating a fracture growth curve based on the poromechanic pressure values. For example, once a local solution in step 306 is determined, further dimensions (e.g., fracture half-length) of the particular hydraulic fracture 112 with respect to time may be determined to obtain the fracture growth curve. For example, the observed pressure in the monitor wellbore 110 (e.g., from the pressure sensor 114) relative to fracture operation time during a treatment in the treatment wellbore 106, $$\frac{\Delta P_{ij}}{\Delta P_{net}^j}(t),$$

is transformed into a time-dependent fracture dimension, $FHL_{ij}(t)$ by applying a transfer function, B. B, in some aspects, is non-linear as a function of time. Accordingly:

$$B(FHLij(t)) = \frac{\Delta P_{ij}}{\Delta P_{net}^j}(t) \approx K_{ij}(t). \qquad \text{Eq. 7}$$

Figure 5:
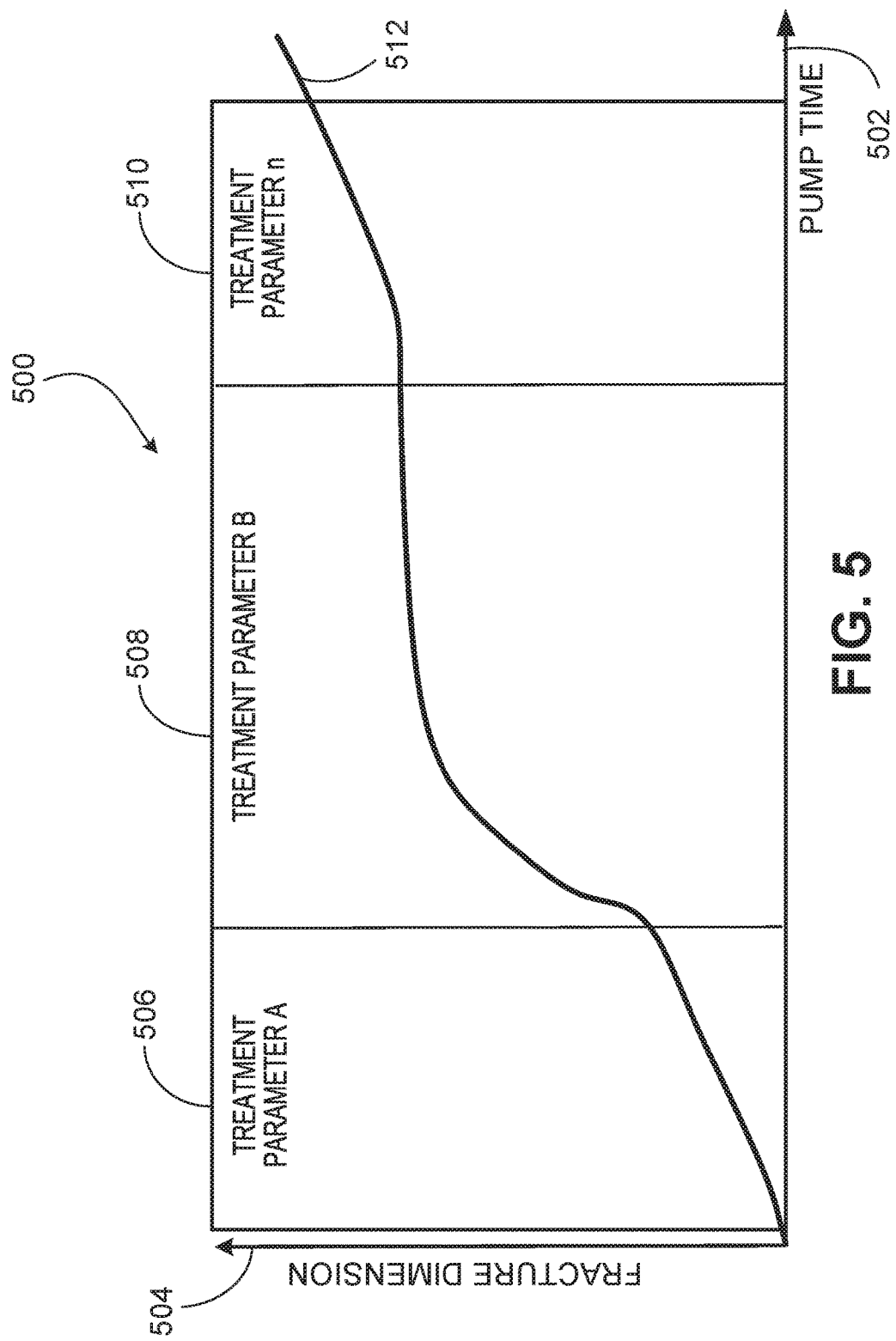
FIG. 5 is a graphical representation of fracture growth curve generated by the hydraulic fracturing modeling system during a hydraulic fracturing operation.

Thus, the transfer function can be estimated by the gain, $K_{ij}$. In some aspects, this transfer function is implemented as a lookup table 140 stored in the memory 132 of the hydraulic fracturing modeling system 120. Once multiple values of the $FHL_{ij}$ (t) are determined, the fracture growth curve can be plotted, such as is shown in FIG. 5. FIG. 5 is a graphical representation 500 of fracture growth curve 512 generated by the hydraulic fracturing modeling system during a hydraulic fracturing operation. As shown, the fracture dimension (in this case, fracture half-length) is represented on the y-axis 504, while time (e.g., pump time operation of pump 116) is represented on the x-axis 502. As shown, different portions of the fracture growth curve 512 may be overlaid, or sectioned, according to particular fracture treatment parameters. For example, as shown, three different treatment parameters "A", "B", . . . , "n" are overlaid in order to relate the fracture growth curve to the actual fracture treatment of the treatment wellbore 110. These treatment parameters can be, for example, a first fracturing fluid type that was used in a first half of the pump time and a second fracturing fluid type that was used for the second half of the pump time. Treatment parameters can also involve the treatment pressure, proppant concentration, fluid rate, moment that a diverter is dropped, different types of proppant (e.g., mesh size of the sand). Thus, changes in the fracture growth curve can be related to a treatment parameter change, if any.

Method 300 may include further operations and steps as well. For example, in some aspects, the generated fracture growth curve may be presented to the treatment operator, as well as recommendations based on the curve. For instance, recommendations may include adjusting one or more parameters of the current hydraulic fracturing operation in the treatment wellbore 106 or a future hydraulic fracturing operation (e.g., in treatment wellbore 106 or another wellbore).

Implementations according to the present disclosure may also include computer-implemented methods, systems and apparatus for determining a proppant area of a hydraulic fracture. Proppant (e.g., sand or other particle) may be mixed with a hydraulic fracturing fluid to hold fractures open after a hydraulic fracturing treatment, e.g., in the treatment well 106. Thus, in some aspects, the proppant bears a closure weight of the fracture once the hydraulic fracturing fluid leaks off (thereby removing the fluid pressure from bearing the weight of the closure). By holding open the fracture, the proppant may create an open conduit for production of hydrocarbon fluid from the subterranean zone 104 to the wellbore 106. In some aspects, however, proppant in the hydraulic fracturing fluid may not extend or reach to a maximum dimension (e.g., fracture half length, fracture length, fracture height) of the hydraulic fracture. Thus, even though the hydraulic fracture may initially have a certain maximum dimension, without proppant extending to that maximum dimension, the fracture will start to close off at that dimension over time (e.g., once the hydraulic fracturing fluid pressure is removed from the fracture).

Figure 6:
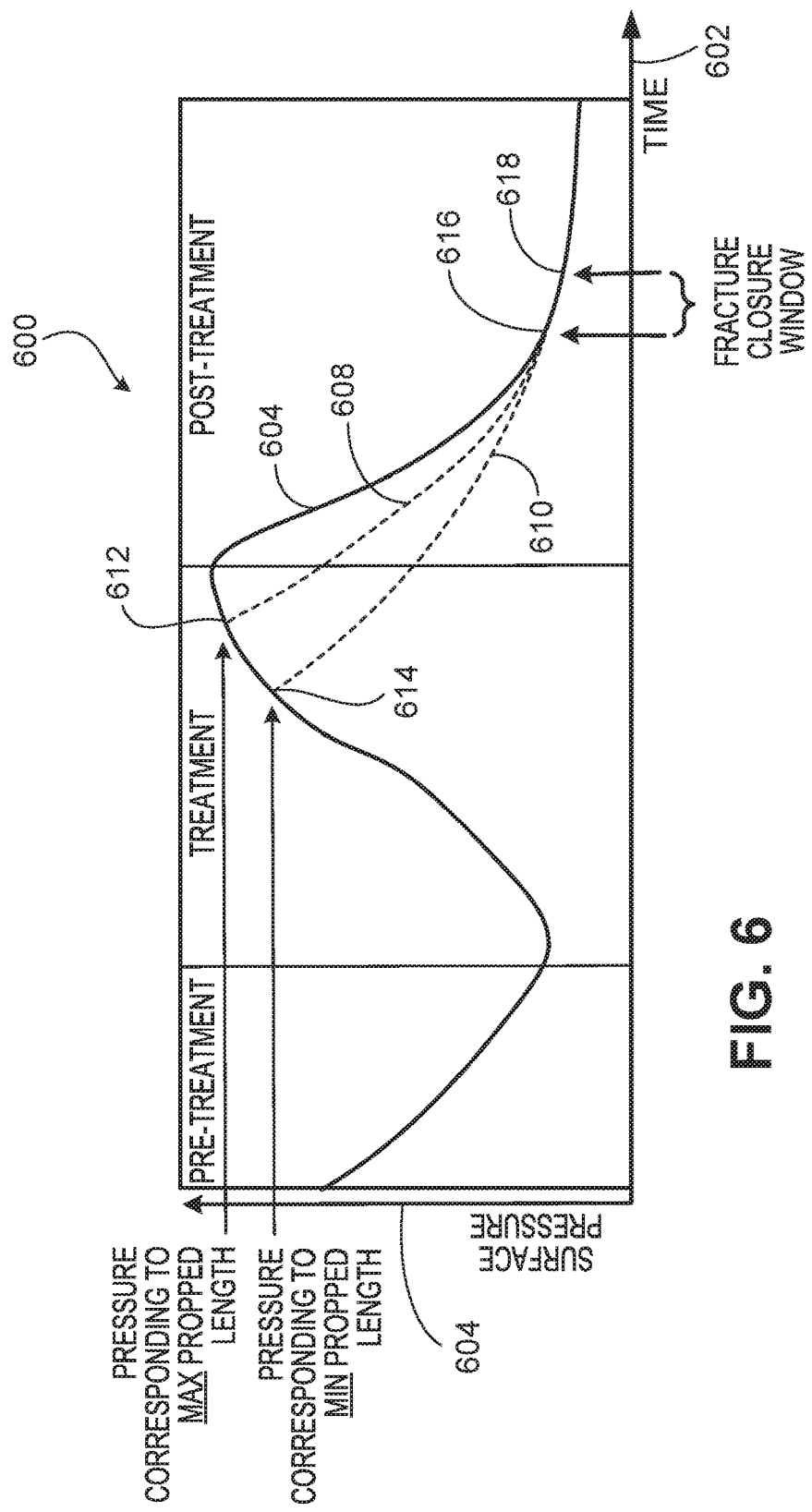
FIG. 6 is a graphical representation of a leak-off curve generated by the hydraulic fracturing modeling system during a hydraulic fracturing operation.

In some aspects, techniques for determining a proppant area of a hydraulic fracture may build on the method 300 described herein that results in a determination of a hydraulic fracture growth curve. For example, at least a portion of method 300 may be used to determine a proppant area of the hydraulic fracture based on a measured leak-off pressure curve relative to pump run time. For example, FIG. 6 shows a graphical representation 600 of a leak-off curve generated by the hydraulic fracturing modeling system 120 during a hydraulic fracturing operation. As shown, graph 600 includes a y-axis 604 that defines a fluid pressure measured by pressure sensor 114 at the monitor wellbore 108 and an x-axis 602 that is defined by time, and more specifically, a run-time of the hydraulic fracturing fluid pump 116 (or pumps 116). By measuring the pressure signal values over the run time of the pump 116 (e.g., during a hydraulic fracturing operation in the treatment wellbore 106 to generate a particular hydraulic fracture 112), a pressure vs. time (or "leak-off") curve 604 is generated as shown. As shown in FIG. 6, once the fracture treatment ends (e.g., the pumps shut off), the pressure begins to drop and eventually levels off in the "post treatment" area of the curve 604. The drop in the pressure (e.g., from the shut-off time to point 616 on the curve 604) may represent the leaking off of the fracturing fluid before the hydraulic fracture begins to close down on any proppant embedded in the fracturing fluid and left behind in the fracture (e.g., a proppant "landing point"). In some aspects, the proppant landing point may be a proppant landing range over time, rather than a distinct point in time.

Based on the curve 604, the landing point (or range) of the proppant may be determined, for example, by transforming the curve 604 into a pressure vs. square root of time curve (from a pressure vs. time curve). A derivative of the transformed curve 604 may then be taken to determine a proppant landing time range, e.g., a range in which the fracture closure pressure switches from being borne by the hydraulic fracturing fluid pressure to being borne by the proppant. For example, as shown on the curve 604, point 616 represents a beginning time instant of the proppant landing range and point 618 represents an end time instant of the proppant landing range. Points 616 and 618 are determined, for example, based on the derivative of the transformed curve 604.

Figure 7:
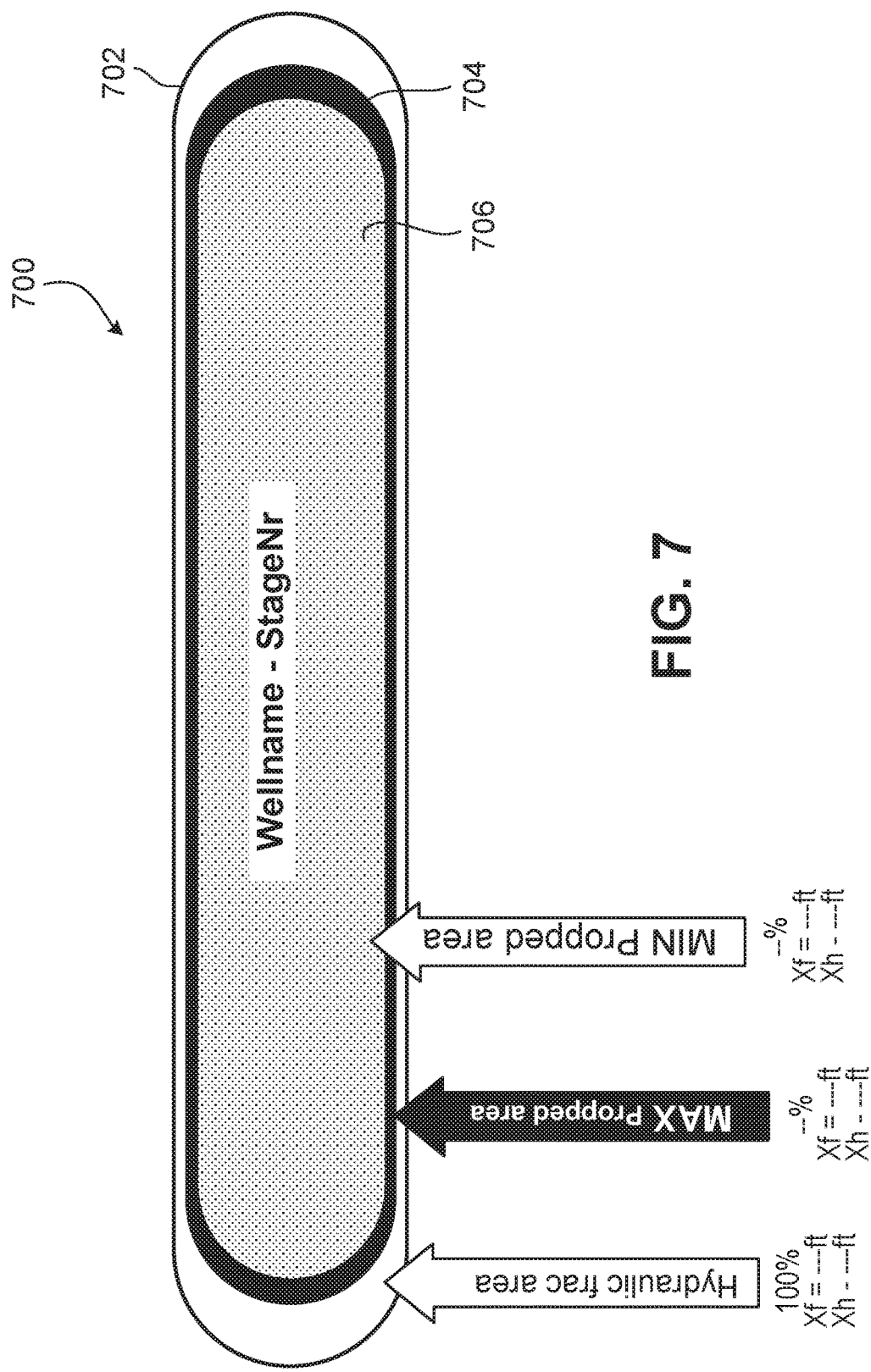
FIG. 7 is a schematic illustration of a range of proppant-filled area of a hydraulic fracture determined by the hydraulic fracturing modeling system.

Once the proppant landing time range is found (as shown by points 616 and 618), a "pre-closure" portion of the curve 604 (to the left of point 616) and a "post-closure" portion of the curve 604 (to the right of point 618). In order to find the fluid pressure range that corresponds to the time range of the landing range, two back-extrapolated curves (608 and 610, shown in dotted lines) may be determined. The back-extrapolated curves 610 and 608 start from points 618 and 616, respectively, and intersect the leak-off curve 604 at points 614 and 612, respectively. Point 612 on the curve 604, as shown, represents a fluid pressure (measured by the pressure sensor 114 at the monitor wellbore 108) that corresponds to the maximum propped dimension (e.g., fracture half-length or fracture length). Point 614 on the curve 604, as shown, represents a fluid pressure (measured by the pressure sensor 114 at the monitor wellbore 108) that corresponds to the minimum propped dimension (e.g., fracture half-length or fracture length). Turning briefly to FIG. 7, this figure is a schematic illustration 700 of a range of proppant-filled area of a hydraulic fracture determined by the hydraulic fracturing modeling system 120. For instance, as shown, the minimum propped dimension (e.g., area) is shown as area 706 while the maximum propped dimension (e.g., area) is shown as area 704. The dimension of the hydraulic fracture (as determined by method 300) is represented as area 702 and, as shown, is larger than the propped area range.

Once points 612 and 614 are determined on the curve 604, these pressure values may be used in method 300 to determine a "propped" fracture dimension (e.g., area as derived from fracture half-length) range. For example, the pressure values at points 612 and 614 may be inserted as the "identified poromechanic pressure signals" in step 304. Thus, execution of steps 304 and 306, as described previously, determine two propped fracture half-lengths (a minimum corresponding to point 614 and a maximum corresponding to point 612). The two determined propped fracture half-lengths may then be used to calculate two propped fracture areas (e.g., assuming constrained height of the fracture).

Other techniques may be used to determine a propped fracture area of a hydraulic fracture from a monitor wellbore. For example, in some aspects, the determination of propped fracture area of a monitor wellbore according to the previous description, which relies on the method 300 and the leak-off curve 604, may assume or consider that the fracture dimensions of both the treatment fracture and the monitor fracture are constant over time. For the set of dimensions of the treatment fracture, $D_f$, this may be a valid assumption, since a snap-shot of the hydraulic fracture dimensions at the moment when this fracture is completed is being determined.

For the set of monitor fracture dimensions, $D_m$, however, this assumption may be too strict, since a monitor stage can be "active" (e.g., change dimension) for an extended period of time, typically spanning from a view hours to weeks. During this period, the monitor fracture may lose fluid into the formation (leak-off), which reduces the total amount of fluid in the monitor fracture and may result in a gradual closure of the fracture on the proppant. Resulting from the leak-off, the effective dimensions of the monitor fracture may typically shrink as the monitor fracture goes from a fully fluid-supported fracture (for example, right after treatment completion) to a proppant-supported fracture.

Figure 8:
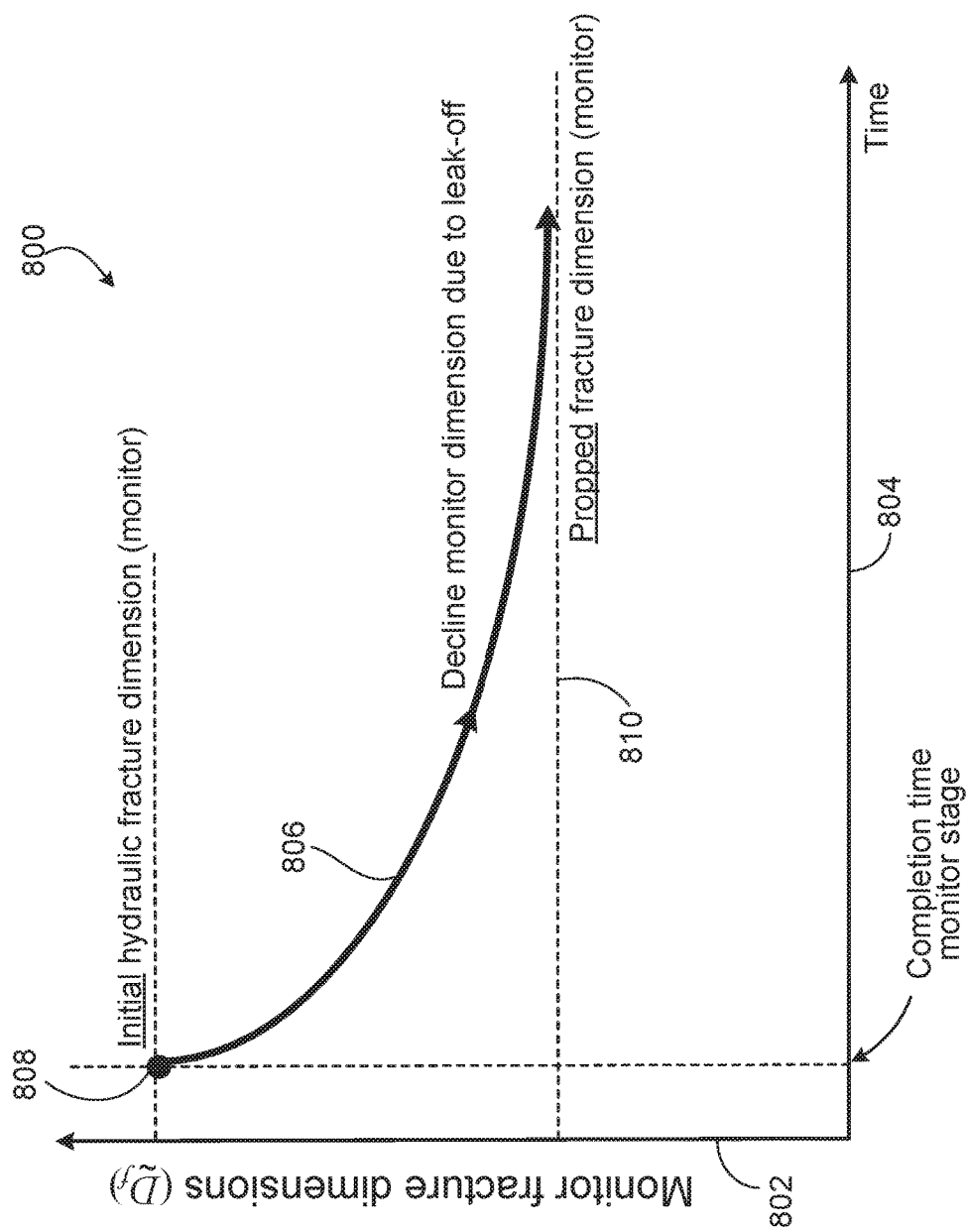
FIG. 8 is a graphical representation of a decline in dimensions of a monitor fracture from fracture completion due to leak-off.

Therefore, in the limit, the monitor fracture dimensions may converge to the propped fracture dimensions. For example, as shown in FIG. 8, a graphical representation 800 of a decline in dimensions of a monitor fracture from fracture completion due to leak-off is illustrated. Graph 800 includes a y-axis 802 that represents the set of monitor fracture dimensions, $D_m$, and an x-axis 804 that represents time. Graph 800 includes a curve 806 that represents $D_m$ over time starting approximately at the completion time instant of the monitor fracture. Point 808 on graph 800 represents the dimension of the monitor fracture (e.g., at its largest) at the completion time instant of the monitor fracture. Line 810 represents the asymptotic propped fracture dimension of the monitor fracture. As shown, curve 806 approaches (converges to) line 810 as time goes to infinity (i.e., much after the monitor fracture has been completed). This convergence of the monitor dimensions towards the propped dimensions may be leveraged.

For example, Equation 1 is rewritten here in slightly different form:

$$K_{ij} = f(D(t_f)_m^i, D_f^j, \vec{X}_{ij}) \qquad \text{Eq. 1}$$

Here, the dimensions, D, may include a set of geometry attributes such as fracture half-length on both sides of a wellbore, fracture height, fracture azimuth, vertical asymmetry with respect to wellbore, and fracture shape, rather than a single "dimension." Also, in this version of Equation 1, $t_f$ is the treatment time of the fractured stage, $f$. This slightly different form of Equation 1 follows from allowing a transient monitor fracture dimension.

This version of Equation 1 indicates that for each of the successive stages monitored, the monitor dimensions can vary. In some aspects, the monitor dimensions vary by decreasing. In order to match the monitor dimensions, some level of constraint may be needed; otherwise there would be an under-constrained (e.g., non-unique) situation, where the monitor (with its constant decreasing dimensions) observes insufficient treatment stages to be accurately determined.

In some aspects, there may be several possible types of constraints that may be applied, each of which providing a process for determining a propped area of a fracture. For example, a first type of constraint is based on a functional (parametric) description of the transient monitor dimension. As another example, a second type of constraint may rely on an assumption that, over short periods of time, the monitor dimension can be assumed to be constant.

In an example aspect associated with the first type of constraint, a decline function may be defined for the decreasing monitor dimensions:

$$D(t_f)_m^i = D(t_\infty)_m^i + [D(t_0)_m^i - D(t(t_\infty)_m^i] \exp(-\alpha \Delta t) \qquad \text{Eq. 8,}$$

Where $\alpha$ is leak-off rate, $D(t_\infty)_m^i$ is the propped fracture dimensions, and $D(t_0)_m^i$ is the hydraulic fracture hydraulic dimensions. Here, $\Delta t$ equals the time interval between the completion of the monitor stage time instant $(t_m)$ and the completion of stage, $f$, $(t_f)$. In other words, $\Delta t = t_f - t_m$. In alternative implementations, a different decline function, or another power law function may be defined for the decreasing monitor dimensions.

These parameters may be added to the set of degrees of freedom (degree of freedoms) that is being solved for according to step 304 of method 300. As described previously, completion of step 304 provides the final global solution that includes a determination of the monitor fracture dimension (e.g., of fracture 110), $D_m^i$; the common or representative dimension 115 of the treatment fracture stage 113 (that included hydraulic fractures 112), and the vector, $X_{ij}$, that represents the relative position of the fractures 110 and 112 in the stage 113 (e.g., as constrained by the discrete perforation locations). Thus, in this aspect of determining a propped area of a hydraulic fracture according to the first type of constraint, two monitor fracture dimensions (initial hydraulic fracture dimension of the monitor fracture and final propped dimensions of the monitor fracture) are simultaneously solved. Thus, the solution of this system may directly provide the desired propped fracture dimensions.

Figure 9:
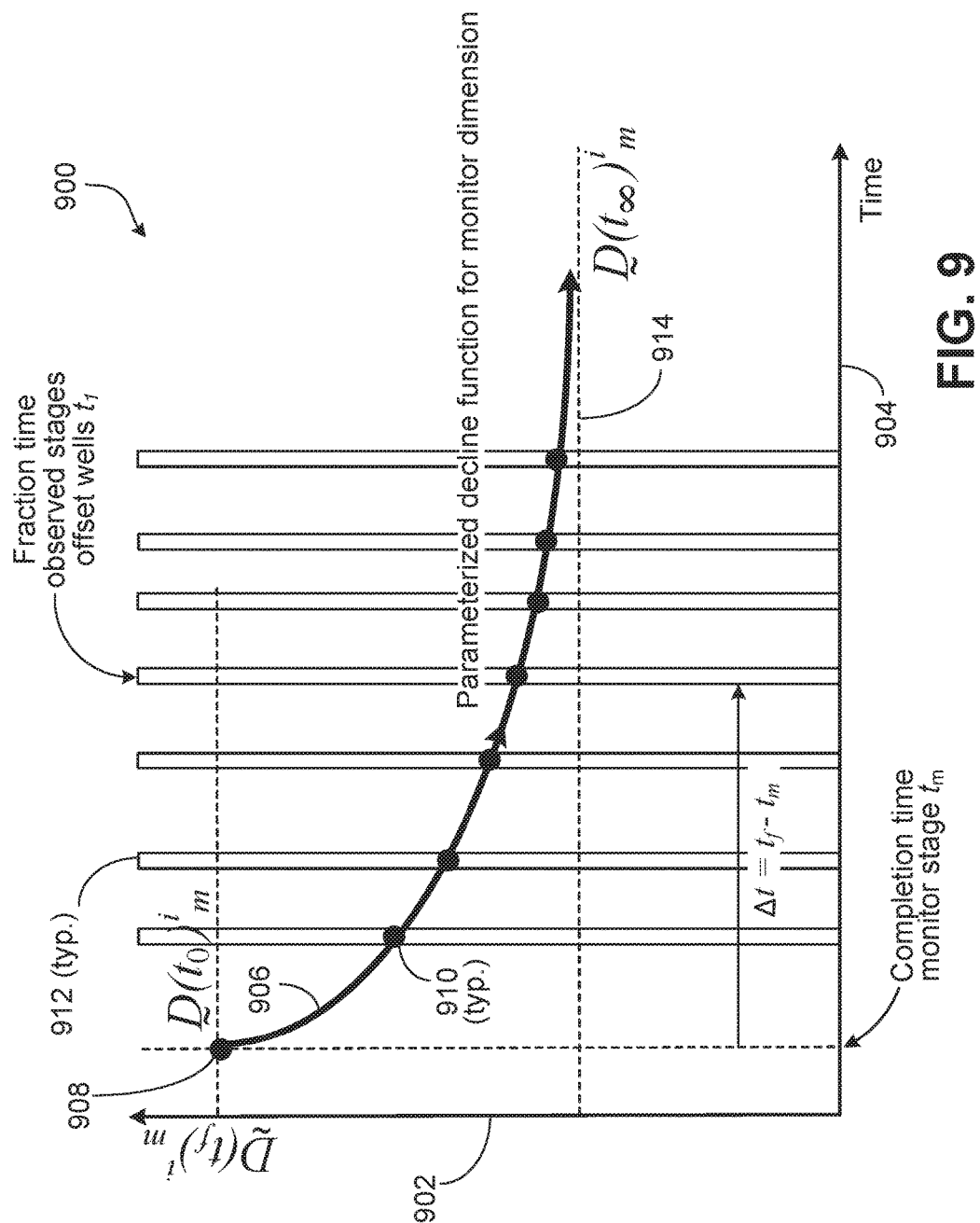
FIG. 9 shows a graph of a parameterized decline function overlaid on multiple treatment times of treatment fracture stages that a monitor fracture observes.

In another example aspect, the second type of constraint may rely on an assumption that, over short periods of time, the monitor dimension can be assumed to be constant. This may enable the definition of sets of observed stages, which are completed in a relatively short time period, and during which completion, the monitor dimension maybe approximated to be constant. This second type of constraint may yield a two-step process. For example, as a first sub-step, FIG. 9 shows a graph 900 of a parameterized decline function overlaid on multiple treatment times of treatment fracture stages that a monitor fracture observes. Graph 900 includes a y-axis 902 that represents the set of dimensions of a monitor fracture stage at a treatment time of the treatment fracture stage. Graph 900 also includes an x-axis 904 that represents time, e.g., from the monitor fracture stage. Curve 906 represents the dimensions of the monitor fracture, $D_m$, over time starting approximately at the completion time instant of the monitor fracture stage. As shown, points 910 represent the dimensions of the monitor fracture, $D_m$, at particular time observed fracture stages 912 of the treatment well. As with FIG. 8, point 908 represents the dimension of the monitor fracture (e.g., at its largest) at the completion time instant of the monitor fracture. Line 914 represents the asymptotic propped fracture dimension of the monitor fracture. As shown, curve 906 approaches (converges to) line 914 as time goes to infinity (i.e., much after the monitor fracture has been completed).

Figure 10:
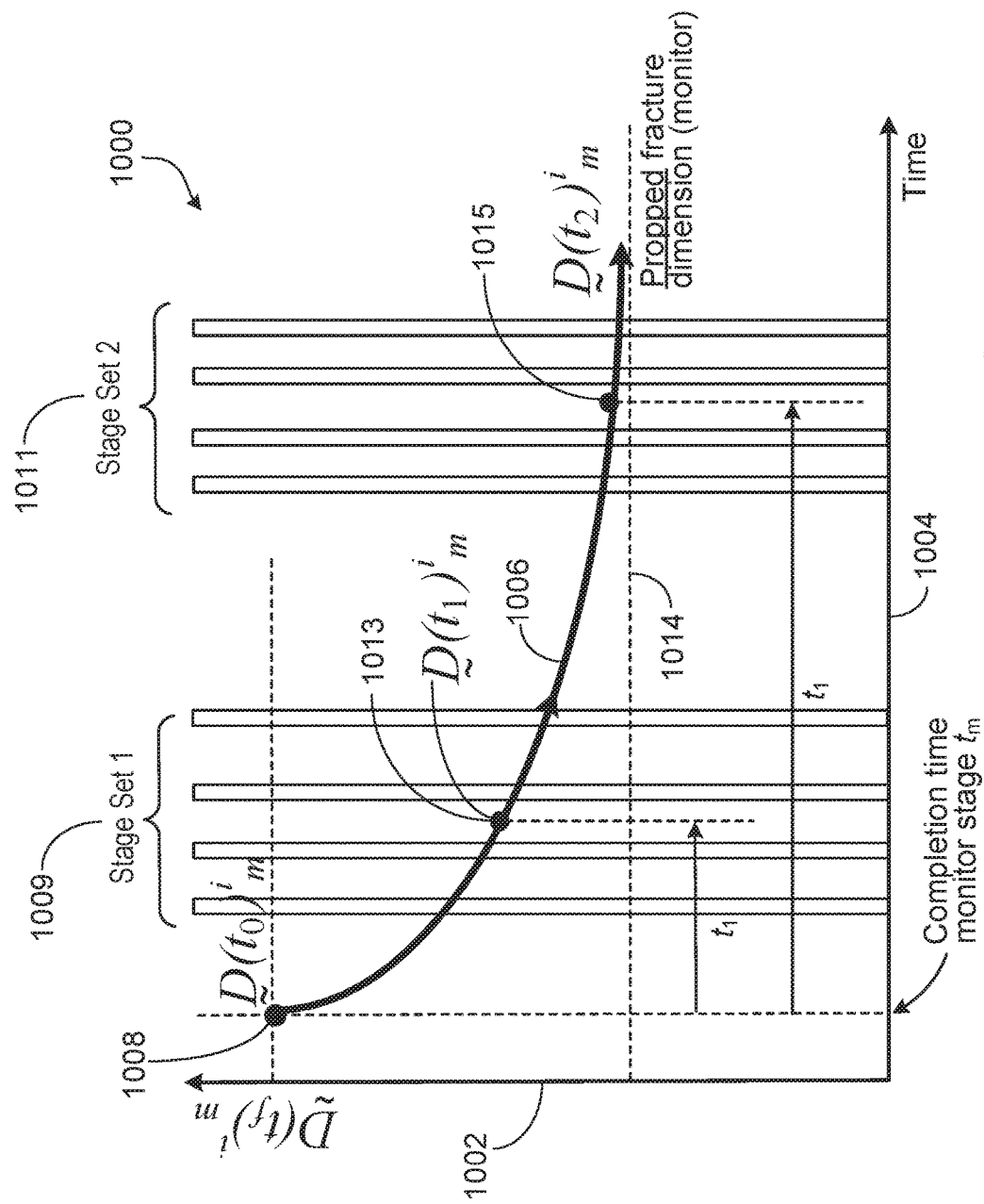
FIG. 10 shows a graph of a step-wise monitor dimension decline based on stage set and trend-line towards the converged monitor dimension to determine propped fracture dimensions of a monitor fracture.

Solving for the system according to step 304 of method 300, for this second type of constraint, may not directly yield the desired propped fracture dimensions. Thus, as a second sub-step, a trend line may be fitted through the mapped points 910 $(t_j D(t_j)_m^i)$ of curve 906. For example, FIG. 10 shows a graph 1000 of a step-wise monitor dimension decline based on stage set and trend-line towards the converged monitor dimension to determine propped fracture dimensions of a monitor fracture. Graph 1000 includes a y-axis 1002 that represents the set of dimensions of a monitor fracture stage at a treatment time of the treatment fracture stage. Graph 1000 also includes an x-axis 1004 that represents time, e.g., from the monitor fracture stage. Curve 1006 represents the trend line of the dimensions of the monitor fracture, $D_m$, over time starting approximately at the completion time instant of the monitor fracture stage. Point 1008 represents the dimension of the monitor fracture (e.g., at its largest) at the completion time instant of the monitor fracture. Line 1014 represents the asymptotic propped fracture dimension of the monitor fracture. As shown, curve 1006 approaches (converges to) line 1014 as time goes to infinity (i.e., much after the monitor fracture has been completed).

Regarding the first sub-step, as shown in graph 1000, three points are used to define the trend line 1006. The first point 1008 represents the dimension of the monitor fracture as of the completion time, $t_0$, of this fracture. The dimensions of the monitor fracture at this time instant must be the largest estimate of the propped fracture dimensions of the monitor fracture, i.e., the propped dimensions cannot be larger than the largest estimate of the monitor fracture dimensions. The second point 1013 is shown as having dimensions less than those of point 1008, e.g., due to leakoff, and represents the dimensions of the monitor fracture at a time of a first stage set completion, $t_1$, past the completion time, $t_0$. In other words, the dimensions at point 1013 represent the monitor fracture dimensions when the first stage set of treatment fractures observed by the monitor fracture is completed. The third point 1015 is shown as having dimensions less than those of points 1008 and 1013, e.g., due to leakoff, and represents the dimensions of the monitor fracture at a time of a second stage set completion, $t_2$, past the completion time, $t_0$. In other words, the dimensions at point 1015 represent the monitor fracture dimensions when the second stage set of treatment fractures observed by the monitor fracture is completed.

Regarding the second sub-step, the trend line 1006, given the three points 1008, 1013, and 1015, may then be extrapolated to determine the decreasing trend of the propped monitor fracture dimensions. In some aspects, a regression curve may be fit to the three points 1008, 1013, and 1015. In some aspects, more points (e.g., more than three) may be determined (e.g., for third, fourth, and additional stage sets of the treatment fracture). The trend curve 1006, therefore, may be regression fitted to more than three points as well.

The features described can be implemented in digital electronic circuitry, or in computer hardware, firmware, software, or in combinations of them. The apparatus can be implemented in a computer program product tangibly embodied in an information carrier, for example, in a machine-readable storage device for execution by a programmable processor; and method steps can be performed by a programmable processor executing a program of instructions to perform functions of the described implementations by operating on input data and generating output. The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) monitor for displaying information to the user and a keyboard and a pointing device such as a mouse or a trackball by which the user can provide input to the computer. Additionally, such activities can be implemented via touchscreen flat-panel displays and other appropriate mechanisms.

The features can be implemented in a control system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include a local area network ("LAN"), a wide area network ("WAN"), peer-to-peer networks (having ad-hoc or static members), grid computing infrastructures, and the Internet.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination.

Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

A number of implementations have been described. Nevertheless, it will be understood that various modifications may be made without departing from the spirit and scope of the disclosure. For example, example operations, methods, or processes described herein may include more steps or fewer steps than those described. Further, the steps in such example operations, methods, or processes may be performed in different successions than that described or illustrated in the figures. Accordingly, other implementations are within the scope of the following claims.

What is claimed is:

1. A structured data processing system for determining a hydraulic fracture dimension, comprising:
    one or more hardware processors;
    a memory in communication with the one or more hardware processors, the memory storing a data structure and an execution environment, the data structure storing data that comprises a plurality of pressure signal values of a first fracturing fluid in a monitor wellbore, formed from a terranean surface into a subsurface formation, the first fracturing fluid in direct fluid communication with a first hydraulic fracture formed from the monitor wellbore into the subsurface formation, each of the plurality of pressure signal values comprising a pressure change in the first fracturing fluid that is induced by formation of a second hydraulic fracture from a treatment wellbore in the subsurface formation, the second hydraulic fracture formed by pumping a second fracturing fluid in the treatment wellbore, the execution environment comprising:
        a fracture growth solver configured to perform operations comprising:
            determining a particular pressure signal value of the plurality of pressure signal values;
            based on the determined particular pressure signal value, determining a particular value of a dimension of the second hydraulic fracture formed from the treatment wellbore, the dimension of the second hydraulic fracture comprising a geometric attribute of the second hydraulic fracture; and
            determining, based at least in part on (i) the determined particular value of the dimension, and (ii) a first pressure signal value of the plurality of pressure signal values that is less than the determined particular pressure signal value, a first intermediate value of the dimension of the second hydraulic fracture that is less than the determined particular value of the dimension of the second hydraulic fracture, the first intermediate value being between an initial value of the dimension of the second hydraulic fracture and a value of the dimension of the second hydraulic fracture at a pump shut-off of the pumping of the second fracturing fluid in the treatment wellbore;
        a user interface module that generates a user interface that renders one or more graphical representations of the determined first intermediate value of the dimension of the second hydraulic fracture; and
        a transmission module that transmits, over one or more communication protocols and to a computing device, data that represents the one or more graphical representations.

2. The system of claim 1, wherein the geometric attribute of the second hydraulic fracture comprises at least one of a value of a half-length of the second hydraulic fracture, a value of a height of the second hydraulic fracture, or a value of an area of the second hydraulic fracture.

3. The system of claim 1, wherein the fracture growth solver is configured to perform operations further comprising:
    identifying a first fracture stage group of the treatment wellbore that comprises a set of hydraulic fractures formed from the treatment wellbore, the set of hydraulic fractures including the second hydraulic fracture formed from the treatment wellbore;
    minimizing an error inequality that comprises a ratio of the determined fluid pressure and the determined particular pressure signal value;
    determining, based on the minimized error inequality, a common dimension of each of the hydraulic fractures in the set of hydraulic fractures formed from the treatment wellbore; and
    determining, based on the minimized error inequality, a dimension of the first hydraulic fracture and a dimension between the first hydraulic fracture and the set of hydraulic fractures formed from the treatment wellbore.

4. The system of claim 3, wherein the error inequality comprises a penalty function.

5. The system of claim 3, wherein the fracture growth solver is configured to perform operations further comprising determining the particular value of the dimension of the second hydraulic fracture formed from the treatment wellbore based at least in part on a deviation of the particular value of the dimension from the common dimension of each of the hydraulic fractures in the set of hydraulic fractures formed from the treatment wellbore.

6. The system of claim 5, wherein the operation of determining the particular value of the dimension of the second hydraulic fracture formed from the treatment wellbore further comprises perturbing a plurality of values of the dimension of the second hydraulic fracture as a function of the dimension of the first hydraulic fracture and the dimension between the first hydraulic fracture and the set of hydraulic fractures formed from the treatment wellbore.

7. The system of claim 6, wherein the operation of perturbing the plurality of values of the dimension of the second hydraulic fracture comprises determining an optimal value of the dimension based on a numerical model that comprises:
    the plurality of values of the dimension of the second hydraulic fracture;
    the plurality of values of the dimension of the first hydraulic fracture; and the dimension between the first hydraulic fracture and the set of hydraulic fractures formed from the treatment wellbore.

8. The system of claim 1, wherein the first intermediate value of the dimension comprises at least one of an intermediate value of a half-length of the second hydraulic fracture, an intermediate value of a height of the second hydraulic fracture, or an intermediate value of an area of the second hydraulic fracture.

9. The system of claim 1, wherein the fracture growth solver is configured to perform operations further comprising:
determining, based at least in part on (i) the determined particular value of the dimension, and (ii) a second pressure signal value of the plurality of pressure signal values that is less than the determined particular pressure signal value, a second intermediate value of the dimension of the second hydraulic fracture that is less than the determined particular value of the dimension of the second hydraulic fracture, the second intermediate value of the dimension being between the initial value of the dimension of the second hydraulic fracture and the value of the dimension of the second hydraulic fracture at the pump shut-off of the pumping of the second fracturing fluid in the treatment wellbore; and
generating a fracture growth curve of the second hydraulic fracture based on the first and second intermediate values of the dimension and the determined particular value of the dimension.

10. The system of claim 9, wherein the fracture growth solver is configured to perform operations further comprising:
generating the fracture growth curve of the second hydraulic fracture based on a continuum that comprises the first and second intermediate values of the dimension and the determined particular value of the dimension; and
determining additional intermediate values of the dimension of the second hydraulic fracture based on the generated fracture growth curve.

11. The system of claim 9, wherein the fracture growth solver is configured to perform operations further comprising graphically presenting the generated fracture growth curve to a user.

12. The system of claim 9, wherein the fracture growth solver is configured to perform operations further comprising determining, based on the generated fracture growth curve, at least one hydraulic fracturing operation action,
the user interface module is configured to generate a user interface that renders one or more graphical representations of the at least one hydraulic fracturing operation action, and
the transmission module is configured to transmit, over the one or more communication protocols and to the computing device, data that represents the one or more graphical representations of the at least one hydraulic fracturing operation action.

13. The system of claim 12, wherein the at least one hydraulic fracturing operation action comprises at least one of:
an action that adjusts a viscosity of the second fracturing fluid pumped to the treatment wellbore;
an action that adjusts a proppant concentration in the second fracturing fluid pumped to the treatment wellbore;
an action that adjusts a pumping rate of the second fracturing fluid pumped to the treatment wellbore;
an action that adjusts a diversion schedule for the treatment wellbore;
an action that adjusts a viscosity of a third fracturing fluid relative to a viscosity of the second fracturing fluid pumped to the treatment wellbore;
an action that adjusts a proppant concentration of the third fracturing fluid relative to a proppant concentration of the second fracturing fluid pumped to the treatment wellbore;
an action that adjusts a pumping rate of the third fracturing fluid relative to a pumping rate of the second fracturing fluid pumped to the treatment wellbore; or
an action that adjusts a diversion schedule for a third wellbore relative to a diversion schedule for the treatment wellbore.

14. The system of claim 1, wherein the particular pressure signal value corresponds to at least one of:
a shut-in time instant of the treatment wellbore upon a cessation of pumping of the second fracturing fluid into the treatment wellbore; or
a maximum pressure of the second fracturing fluid pumped into the treatment wellbore.

15. The system of claim 5, wherein the fracture growth solver is configured to perform operations further comprising normalizing the dimension between the first hydraulic fracture and the set of hydraulic fractures formed from the treatment wellbore in the numerical model to at least one dimensionless value that represents a dimension of the first hydraulic fracture and the set of hydraulic fractures formed from the treatment wellbore, and
the dimensionless value is associated with an estimated aspect ratio of the second hydraulic fracture that comprises a ratio of a height of the second hydraulic fracture to a half-length of the second hydraulic fracture, an estimated overlap percentage between the first hydraulic fracture and the second hydraulic fracture, and an estimated offset between the first hydraulic fracture and the second hydraulic fracture.

16. A computer-implemented method for determining a hydraulic fracture dimension, comprising:
identifying, with one or more hardware processors, a plurality of pressure signal values of a first fracturing fluid in a monitor wellbore, formed from a terranean surface into a subsurface formation, the first fracturing fluid in direct fluid communication with a first hydraulic fracture formed from the monitor wellbore into the subsurface formation, each of the plurality of pressure signal values comprising a pressure change in the first fracturing fluid that is induced by formation of a second hydraulic fracture from a treatment wellbore in the subsurface formation, the second hydraulic fracture formed by a second fracturing fluid in the treatment wellbore;
determining, with the one or more hardware processors, a particular pressure signal value of the plurality of pressure signal values;
based on the determined particular pressure signal value, determining, with the one or more hardware processors, a particular value of a dimension of the second hydraulic fracture formed from the treatment wellbore, the dimension of the second hydraulic fracture comprising a geometric attribute of the second hydraulic fracture;
determining, with the one or more hardware processors, based at least in part on (i) the determined particular value of the dimension, and (ii) a first pressure signal value of the plurality of pressure signal values that is less than the determined particular pressure signal value, a first intermediate value of the dimension of the second hydraulic fracture that is less than the determined particular value of the dimension of the second hydraulic fracture, the first intermediate value being between an initial value of the dimension of the second hydraulic fracture and a value of the dimension of the second hydraulic fracture at a pump shut-off of the pumping of the second fracturing fluid in the treatment wellbore; and graphically presenting, with the one or more hardware processors, the determined first intermediate value of the dimension to a user.

17. The computer-implemented method of claim 16, wherein the geometric attribute of the second hydraulic fracture comprises at least one of a value of a half-length of the second hydraulic fracture, a value of a height of the second hydraulic fracture, or a value of an area of the second hydraulic fracture.

18. The computer-implemented method of claim 16, further comprising:
identifying, with the one or more hardware processors, a first fracture stage group of the treatment wellbore that comprises a set of hydraulic fractures formed from the treatment wellbore, the set of hydraulic fractures including the second hydraulic fracture formed from the treatment wellbore;
minimizing, with the one or more hardware processors, an error inequality that comprises a ratio of the determined fluid pressure and the determined particular pressure signal value; and
determining, with the one or more hardware processors, based on the minimized error inequality, a common dimension of each of the hydraulic fractures in the set of hydraulic fractures formed from the treatment wellbore; and
determining, with the one or more hardware processors, based on the minimized error inequality, a dimension of the first hydraulic fracture and a dimension between the first hydraulic fracture and the set of hydraulic fractures formed from the treatment wellbore.

19. The computer-implemented method of claim 18, wherein the error inequality comprises a penalty function.

20. The computer-implemented method of claim 18, further comprising determining, with the one or more hardware processors, the particular value of the dimension of the second hydraulic fracture formed from the treatment wellbore based at least in part on a deviation of the particular value of the dimension from the common dimension of each of the hydraulic fractures in the set of hydraulic fractures formed from the treatment wellbore.

21. The computer-implemented method of claim 20, wherein determining the particular value of the dimension of the second hydraulic fracture formed from the treatment wellbore further comprises perturbing a plurality of values of the dimension of the second hydraulic fracture as a function of the dimension of the first hydraulic fracture and the dimension between the first hydraulic fracture and the set of hydraulic fractures formed from the treatment wellbore.

22. The computer-implemented method of claim 21, wherein perturbing the plurality of values of the dimension of the second hydraulic fracture comprises determining an optimal value of the dimension based on a numerical model that comprises:
the plurality of values of the dimension of the second hydraulic fracture;
the plurality of values of the dimension of the first hydraulic fracture; and
the dimension between the first hydraulic fracture and the set of hydraulic fractures formed from the treatment wellbore.

23. The computer-implemented method of claim 16, wherein the intermediate value of the dimension comprises at least one of an intermediate value of a half-length of the second hydraulic fracture, an intermediate value of a height of the second hydraulic fracture, or an intermediate value of an area of the second hydraulic fracture.

24. The computer-implemented method of claim 16, further comprising:
determining, with the one or more hardware processors, based at least in part on (i) the determined particular value of the dimension, and (ii) a second pressure signal value of the plurality of pressure signal values that is less than the determined particular pressure signal value, a second intermediate value of the dimension of the second hydraulic fracture that is less than the determined particular value of the dimension of the second hydraulic fracture, the second intermediate value of the dimension being between the initial value of the dimension of the second hydraulic fracture and the value of the dimension of the second hydraulic fracture at the pump shut-off of the pumping of the second fracturing fluid in the treatment wellbore; and
generating, with the one or more hardware processors, a fracture growth curve of the second hydraulic fracture based on the first and second intermediate values of the dimension and the determined particular value of the dimension.

25. The computer-implemented method of claim 24, further comprising:
generating, with the one or more hardware processors, the fracture growth curve of the second hydraulic fracture based on a continuum that comprises the first and second intermediate value of the dimension and the determined particular value of the dimension; and
determining, with the one or more hardware processors, additional intermediate values of the dimension of the second hydraulic fracture based on the generated fracture growth curve.

26. The computer-implemented method of claim 24, further comprising:
determining, with the one or more hardware processors, based on the generated fracture growth curve, at least one hydraulic fracturing operation action; and
graphically presenting the at least one hydraulic fracturing operation action to a user.

27. The computer-implemented method of claim 26, wherein the at least one hydraulic fracturing operation action comprises at least one of:
an action that adjusts a viscosity of the second fracturing fluid pumped to the treatment wellbore;
an action that adjusts a proppant concentration in the second fracturing fluid pumped to the treatment wellbore;
an action that adjusts a pumping rate of the second fracturing fluid pumped to the treatment wellbore;
an action that adjusts a diversion schedule for the treatment wellbore;
an action that adjusts a viscosity of a third fracturing fluid relative to a viscosity of the second fracturing fluid pumped to the treatment wellbore;
an action that adjusts a proppant concentration of the third fracturing fluid relative to a proppant concentration of the second fracturing fluid pumped to the treatment wellbore;

an action that adjusts a pumping rate of the third fracturing fluid relative to a pumping rate of the second fracturing fluid pumped to the treatment wellbore; or an action that adjusts a diversion schedule for a third wellbore relative to a diversion schedule for the treatment wellbore.

28. The computer-implemented method of claim 16, wherein the particular pressure signal value corresponds to at least one of:

a shut-in time instant of the treatment wellbore upon a cessation of pumping of the second fracturing fluid into the treatment wellbore; or a maximum pressure of the second fracturing fluid pumped into the treatment wellbore.

29. The computer-implemented method of claim 21, further comprising normalizing, with the one or more hardware processors, the dimension between the first hydraulic fracture and the set of hydraulic fractures formed from the treatment wellbore in the numerical model to at least one dimensionless value that represents a dimension of the first hydraulic fracture and the set of hydraulic fractures formed from the treatment wellbore, and the dimensionless value is associated with an estimated aspect ratio of the second hydraulic fracture that comprises a ratio of a height of the second hydraulic fracture to a half-length of the second hydraulic fracture, an estimated overlap percentage between the first hydraulic fracture and the second hydraulic fracture, and an estimated offset between the first hydraulic fracture and the second hydraulic fracture.

30. The computer-implemented method of claim 16, wherein the numerical model includes an N-dimensional hypercube, and the N-dimensional hypercube includes a poromechanical model that describes a poromechanical interaction of the second hydraulic fracture and the first hydraulic fracture.

* * * * *